US010121798B2

(12) United States Patent
Lim et al.

(10) Patent No.: US 10,121,798 B2
(45) Date of Patent: Nov. 6, 2018

(54) SEMICONDUCTOR DEVICE INCLUDING STACKED STRUCTURE

(71) Applicants: Yeong Dae Lim, Suwon-si (KR); Seung Jae Jung, Suwon-si (KR)

(72) Inventors: Yeong Dae Lim, Suwon-si (KR); Seung Jae Jung, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 59 days.

(21) Appl. No.: 15/440,647

(22) Filed: Feb. 23, 2017

(65) Prior Publication Data
US 2018/0076214 A1   Mar. 15, 2018

(30) Foreign Application Priority Data
Sep. 9, 2016  (KR) .................. 10-2016-0116179

(51) Int. Cl.
| | |
|---|---|
| H01L 27/11582 | (2017.01) |
| H01L 23/528 | (2006.01) |
| H01L 27/11565 | (2017.01) |
| H01L 29/423 | (2006.01) |
| H01L 29/10 | (2006.01) |

(52) U.S. Cl.
CPC ...... H01L 27/11582 (2013.01); H01L 23/528 (2013.01); H01L 27/11565 (2013.01); H01L 29/1037 (2013.01); H01L 29/4234 (2013.01)

(58) Field of Classification Search
CPC ........... H01L 29/7926; H01L 27/11551; H01L 27/11556; H01L 27/11582
See application file for complete search history.

(56) References Cited

U.S. PATENT DOCUMENTS

| | | | |
|---|---|---|---|
| 8,247,860 B2 | 8/2012 | Iwase et al. | |
| 8,921,182 B2 | 12/2014 | Jung et al. | |
| 8,951,865 B2 | 2/2015 | Goda | |
| 9,018,682 B2 * | 4/2015 | Izumida | H01L 27/1052 257/234 |
| 9,343,322 B2 | 5/2016 | Chen | |
| 2012/0081958 A1* | 4/2012 | Lee | G11C 16/0483 365/185.05 |
| 2012/0211821 A1 | 8/2012 | Matsumoto | |
| 2015/0263036 A1 | 9/2015 | Yasuda et al. | |

(Continued)

FOREIGN PATENT DOCUMENTS

| | | |
|---|---|---|
| JP | 2012174961 A | 9/2012 |
| KR | 20160055744 A | 5/2016 |

*Primary Examiner* — David Spalla
(74) *Attorney, Agent, or Firm* — Harness, Dickey & Pierce, P.L.C.

(57) ABSTRACT

A semiconductor device includes a substrate, a stacked structure on the substrate, and a vertical structure in a hole passing through the stacked structure. The stacked structure includes units stacked on top of each other in a direction perpendicular to a top surface of the substrate. The units include first units and second units between the first units. Each of the first units includes a first interlayer insulating layer on a first gate, and each of the second units includes a second interlayer insulating layer on a second gate. A ratio of a thickness of the second interlayer insulating layer with respect to a thickness of the second gate is different from a ratio of a thickness of the first interlayer insulating layer with respect to a thickness of the first gate.

20 Claims, 22 Drawing Sheets

(56) References Cited

U.S. PATENT DOCUMENTS

2015/0357342 A1\* 12/2015 Lee ................... H01L 27/11582
257/324
2016/0148945 A1   5/2016 Sharangpani et al.

\* cited by examiner

SEMICONDUCTOR DEVICE INCLUDING STACKED STRUCTURE

CROSS-REFERENCE TO RELATED APPLICATION

This application claims priority under 35 U.S.C. § 119 to Korean Patent Application No. 10-2016-0116179 filed on Sep. 9, 2016 in the Korean Intellectual Property Office, the disclosure of which is incorporated herein by reference in its entirety.

BACKGROUND

1. Field

Inventive concepts relate to a semiconductor device having a stacked structure.

2. Description of Related Art

To improve integration of semiconductor devices, a NAND flash device, including word lines aligned in a direction perpendicular to a substrate, and a channel layer inside a hole passing through the word lines, has been developed. As the number of word lines is increased, to increase integration, the difficulties of using an etching process to form a hole passing through the word lines have been increased. As the hole described above is formed, defects, which may degrade characteristics of such semiconductor devices, may occur.

SUMMARY

An aspect of inventive concepts may provide a semiconductor device including a stacked structure.

An aspect of inventive concepts may provide a semiconductor device for improving a function thereof.

According to some example embodiments of inventive concepts, a semiconductor device may include a substrate, a stacked structure on the substrate and including a hole passing through the stacked structure, and a vertical structure in the hole. The stacked structure may include units stacked on top of each other in a direction perpendicular to a top surface of the substrate. The units may include first units and second units between the first units. Each of the first units may include a first gate and a first interlayer insulating layer on the first gate, and each of the second units may include a second gate and a second interlayer insulating layer on the second gate. A ratio of a thickness of the second interlayer insulating layer with respect to a thickness of the second gate may be different from a ratio of a thickness of the first interlayer insulating layer with respect to a thickness of the first gate.

According to some example embodiments of inventive concepts, a semiconductor device may include a substrate, a stacked structure on the substrate and including a hole passing through the stacked structure and having a bowing region, and a vertical structure in the hole. The stacked structure may include units stacked on top of each other in a direction perpendicular to a top surface of the substrate. The units may include first units and a second unit between the first units. Each of the first units may include a first gate and a first interlayer insulating layer on the first gate, and the second unit may include a second gate and a second interlayer insulating layer on the second gate. The second unit opposes at least a portion of the bowing region. A ratio of a thickness of the second interlayer insulating layer with respect to a thickness of the second gate may be different from a ratio of a thickness of the first interlayer insulating layer with respect to a thickness of the first gate.

According to some example embodiments of inventive concepts, a semiconductor device may include a substrate, a stacked structure on the substrate and including a hole passing through the stacked structure, and a vertical structure in the hole. The stacked structure may include units stacked on top of each other in a direction perpendicular to a top surface of the substrate. The units may include first units and second units between the first units. Each of the first units may include a first layer and a first interlayer insulating layer on the first layer, and each of the second units may include a second layer and a second interlayer insulating layer on the second layer. A ratio of a thickness of the second interlayer insulating layer with respect to a thickness of the second layer may be different from a ratio of a thickness of the first interlayer insulating layer with respect to a thickness of the first layer. The first layer and the second layer may be a first gate and a second gate, respectively, or a first sacrificial layer and a second sacrificial layer, respectively.

BRIEF DESCRIPTION OF DRAWINGS

The above and other aspects, features and other aspects of inventive concepts will be more clearly understood from the following detailed description, taken in conjunction with the accompanying drawings, in which.

DETAILED DESCRIPTION

Figure 1:
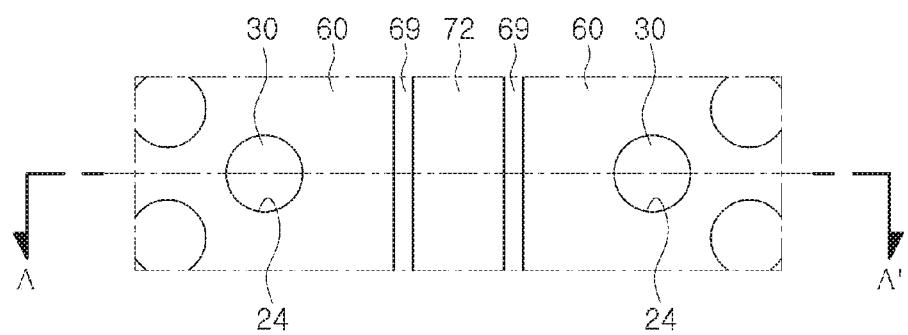
FIG. 1 is a plan view illustrating a semiconductor device according to some example embodiments.
Figure 2:
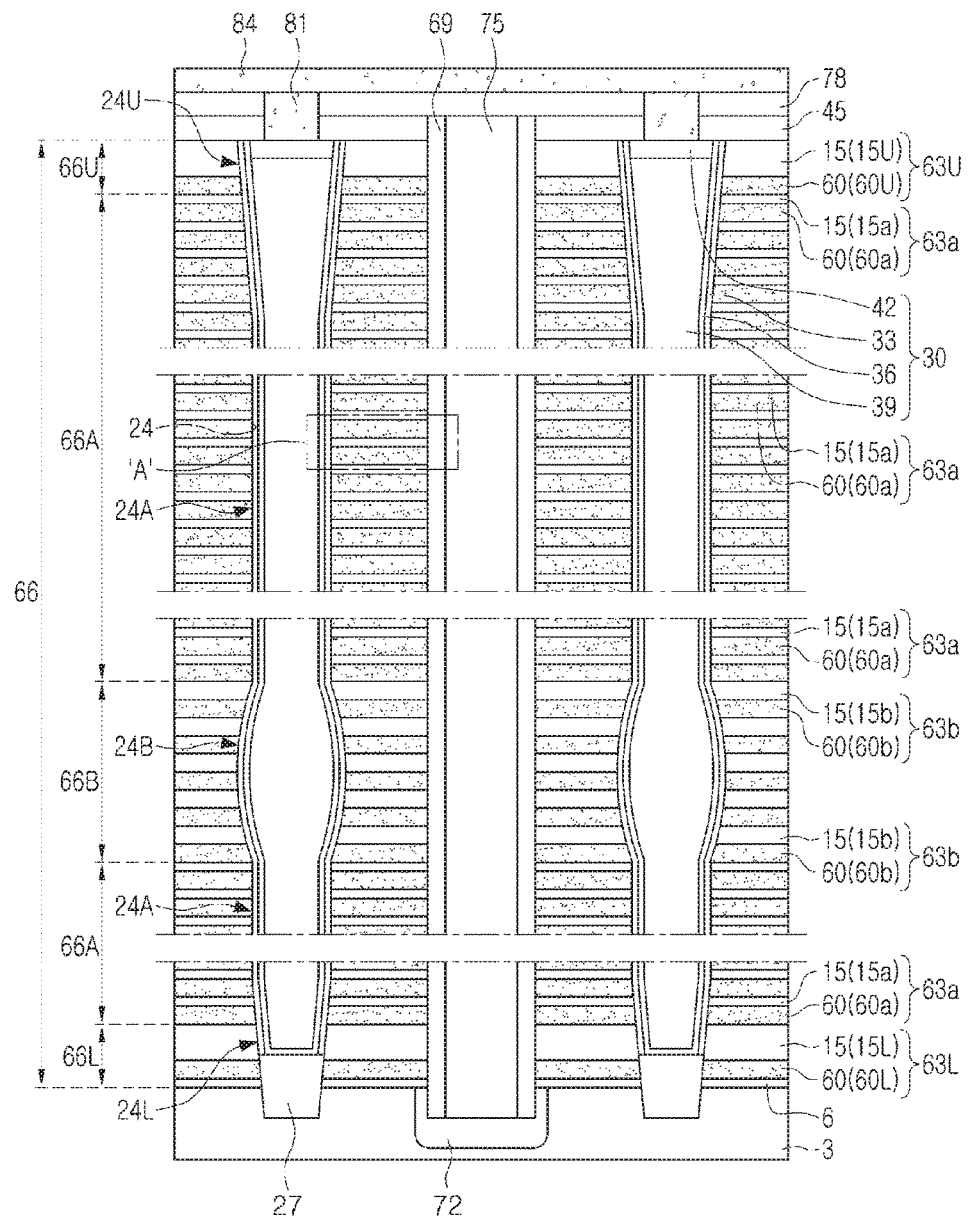
FIG. 2 is a cross sectional view illustrating a semiconductor device according to some example embodiments.

With reference to FIGS. 1 and 2, an example of a semiconductor device according to some example embodiments is described. FIG. 1 is a plan view illustrating a semiconductor device according to some example embodiments, and FIG. 2 is a cross sectional view illustrating a region taken along line A-A' of FIG. 1.

With reference to FIGS. 1 and 2, a substrate 3 may be provided. The substrate 3 may be a semiconductor substrate. A lower insulating layer 6 may be disposed on the substrate 3. The lower insulating layer 6 may be formed of a silicon oxide. A stacked structure 66 may be disposed on the substrate 3. The stacked structure 66 may be disposed on the lower insulating layer 6.

The stacked structure 66 may include a lower stacked region 66L, an upper stacked region 66U above the lower stacked region 66L, first stacked regions 66A disposed between the lower stacked region 66L and the upper stacked region 66U, and a second stacked region 66B disposed between the first stacked regions 66A.

The stacked structure 66 may include stacked units arranged in a direction perpendicular to the substrate 3. Each of the stacked units may include a gate 60 and an interlayer insulating layer 15 disposed on the gate 60.

The stacked units of the stacked structure 66 may include a lower stacked unit 63L disposed inside the lower stacked region 66L, an upper stacked unit 63U disposed inside the upper stacked region 66U, first stacked units 63a disposed inside the first stacked regions 66A, and second stacked units 63b disposed inside the second stacked region 66B.

In an example, the second stacked units 63b are disposed as a plurality of second stacked units, and a smaller number of second stacked units may be disposed as compared to a number of the first stacked units 63a.

In an example, the second stacked units 63b may be disposed between the first stacked units 63a. For example, the second stacked units 63b may be disposed between two first stacked units, vertically adjacent to each other, of the first stacked units 63a.

In an example, the second stacked units 63b may be disposed closer to a lower surface of the stacked structure 66 than to an upper surface thereof.

The lower stacked unit 63L may include a lower gate 60L and a lower interlayer insulating layer 15L disposed on the lower gate 60L. The upper stacked unit 63U may include an upper gate 60U and an upper interlayer insulating layer 15U disposed on the upper gate 60U. Each of the first stacked units 63a may include a first gate 60a and a first interlayer insulating layer 15a disposed on the first gate 60a. Each of the second stacked units 63b may include a second gate 60b and a second interlayer insulating layer 15b disposed on the second gate 60b.

In some example embodiments, a ratio of a thickness of the second interlayer insulating layer 15b and a thickness of the second gate 60b, of the second stacked units 63b, may be different from a ratio of a thickness of the first interlayer insulating layer 15a and a thickness of the first gate 60a, of the first stacked units 63a. For example, the ratio of a thickness of the second interlayer insulating layer 15b, with respect to a thickness of the second gate 60b of the second stacked units 63b, may be greater than the ratio of a thickness of the first interlayer insulating layer 15a, with respect to a thickness of the first gate 60a, of the first stacked units 63a.

A thickness of the upper stacked unit 63U may be thicker than thicknesses of the first stacked units 63a and the second stacked units 63b. The upper gate 60U of the upper stacked unit 63U may have the same thickness as a thickness of the first gate 60a, and the upper interlayer insulating layer 15U of the upper stacked unit 63U may have a thickness thicker than a thickness of the first interlayer insulating layer 15a. In a manner similar thereto, the lower gate 60L of the lower stacked unit 63L may have the same thickness as a thickness of the first gate 60a, and the lower interlayer insulating layer 15L of the lower stacked unit 63L may have a thickness thicker than a thickness of the first interlayer insulating layer 15a.

Holes 24 passing through the stacked structure 66, may be provided. The holes 24 may pass through the stacked structure 66 to be extended inside the substrate 3.

Each of the holes 24 may include an upper hole region 24U passing through the upper stacked region 66U, a lower hole region 24L passing through the lower stacked region 66L, to be extended inside the substrate 3, first hole regions 24A passing through the first stacked regions 66A, and a second hole region 24B passing through the second stacked region 66B. The second hole region 24B may be disposed between the first hole regions 24A.

In an example, the upper hole region 24U may have a width gradually reduced from an upper portion of the upper hole region to a lower portion thereof.

In an example, the second hole region 24B may be a bowing region. For example, the second hole region 24B may be apart having a wider width, compared to widths of the first hole regions 24A adjacent to the second hole region 24B. The second hole region 24B may include apart having a width increased and then decreased again from a lower portion of the second hole region to an upper portion thereof. Thus, the second hole region 24B may have a maximum width in a portion or a middle of the second hole region 24B. Aside wall of the second hole region 24B may include a curved line extended outwardly from the second hole region 24B.

Vertical structures 30 may be disposed inside the holes 24. Semiconductor patterns 27 may be disposed inside the holes 24 and may be disposed below the vertical structures 30. The semiconductor patterns 27 may be epitaxial layers formed in a selective epitaxial growth (SEG) process.

The semiconductor patterns 27 and the vertical structures 30, disposed inside the holes 24, may have a width corresponding to a width of the holes 24. For example, the vertical structures 30 disposed inside the bowing regions 24B of the holes 24 may be formed to have an outwardly convex shape. A width of the vertical structures 30 formed inside the holes 24 may correspond to a width of the holes 24, so descriptions with respect to a width of the vertical structures 30 are omitted.

Each of the vertical structures 30 may include a core pattern 39, a pad 42 disposed on the core pattern 39, and a channel layer 36 covering sides and a bottom of the core pattern 39. The core pattern 39 may be formed of an insulating material such as a silicon oxide or the like. The channel layer 36 may be formed of a semiconductor material such as silicon or the like. The pad 42 may be formed of conductive doped polysilicon. The pad 42 may be a drain of a transistor.

In an example, each of the vertical structures 30 may further include a first gate dielectric structure 33 disposed between the channel layer 36 and the stacked structure 66.

An upper insulating layer 45 may be formed on the stacked structure 66 and the vertical structures 30. A separation pattern 75, passing through the upper insulating layer 45 and the stacked structure 66 and intersecting the stacked structure 66, may be provided. Insulating spacers 69 may be disposed on sides of the separation pattern 75.

In an example, the separation pattern 75 may be formed of a conductive material (e.g., polysilicon, tungsten or the like). An impurity region 72 may be disposed inside the substrate 3 in a lower portion of the separation pattern 75. In an example, the impurity region 72 may be a source of a transistor.

The holes 24 and the vertical structures 30 may be disposed on both sides of the separation pattern 75.

An intermetallic insulating layer 78 may be disposed on the upper insulating layer 45 and the separation pattern 75. A conductive line 84 may be disposed on the intermetallic insulating layer 78. Contact plugs 81 may be disposed between the conductive line 84 and pads 42 of the vertical structures 30. Thus, the conductive line 84 may be electrically connected to the vertical structures 30.

Figure 3:
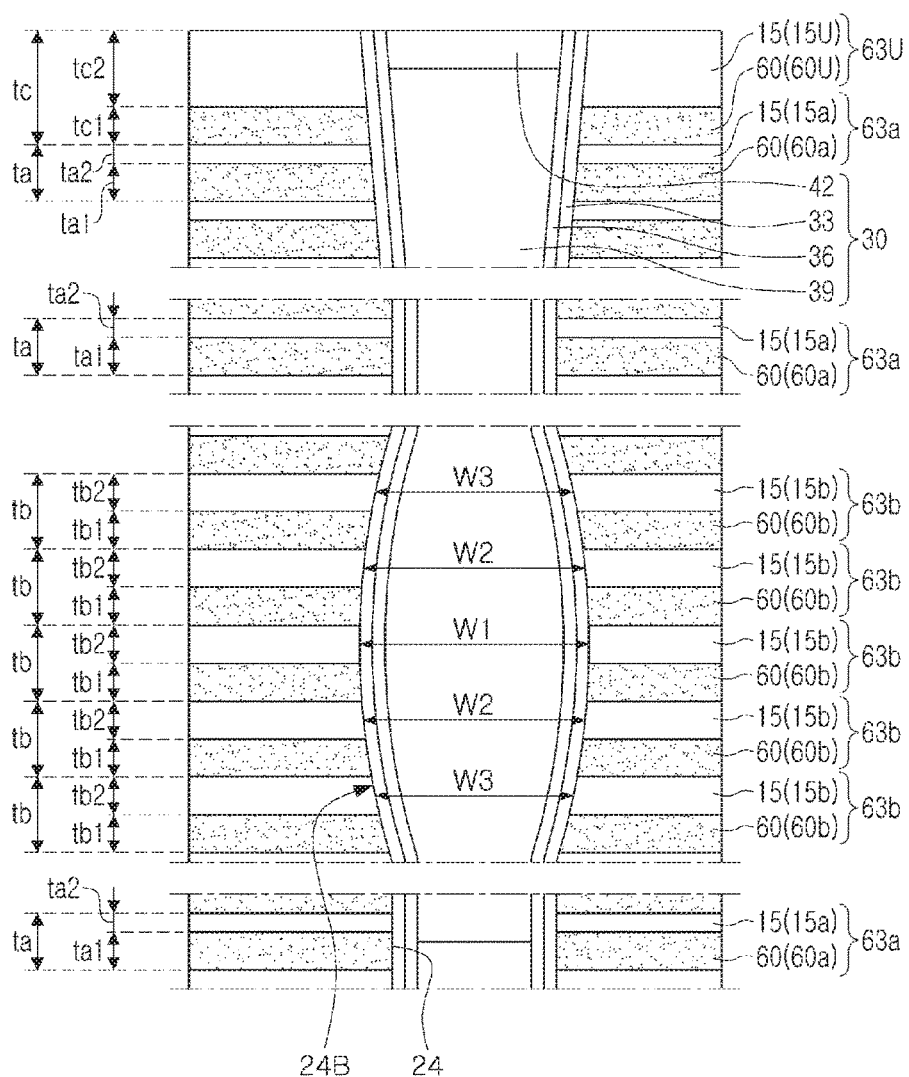
FIG. 3 is a drawing illustrating an example of a component of a semiconductor device according to some example embodiments.

With reference to FIG. 3 along with FIGS. 1 and 2, an example of stacked units of a semiconductor device according to some example embodiments will be described. FIG. 3 is a drawing illustrating an example of stacked units of a semiconductor device according to some example embodiments.

With reference to FIG. 3 along with FIGS. 1 and 2, a thickness tb of each of the second stacked units 63b may be different from a thickness to of each of the first stacked units 63a. For example, the second gate 60b of the second stacked units 63b may have the same thickness tb1 as a thickness ta1 of the first gate 60a of the first stacked units 63a, and the second interlayer insulating layer 15b of the second stacked units 63b may have a thickness tb2, thicker than a thickness ta2 of the first interlayer insulating layer 15a of the first stacked units 63a. Thus, the thickness ta1 of the first gate 60a and the thickness tb1 of the second gate 60b may be the same, and the thickness tb2 of the second interlayer insulating layer 15b may be thicker than the thickness ta2 of the first interlayer insulating layer 15a. Thus, a ratio (tb2/tb1) of the thickness tb2 of the second interlayer insulating layer 15b with respect to the thickness tb1 of the second gate 60b, of the second stacked units 63b, may be greater than a ratio (ta2/ta1) of the thickness ta2 of the first interlayer insulating layer 15a, with respect to the thickness ta1 of the first gate 60a, of the first stacked units 63a.

A thickness tc of the upper stacked unit 63U may be thicker than the thickness to of the first stacked units 63a and the thickness tb of the second stacked units 63b. For example, the upper gate 60U may have the same thickness tc1 as the thickness ta1 of the first gate 60a, and the upper interlayer insulating layer 15U may have a thickness tc2 thicker than the thickness ta2 of the first interlayer insulating layer 15a and the thickness tb2 of the second interlayer insulating layer 15b. In a manner similar thereto, the lower gate (60L in FIG. 2) may have the same thickness as the thickness ta1 of the first gate 60a, and the lower interlayer insulating layer (15L in FIG. 2) may have a thickness thicker than the thickness ta2 of the first interlayer insulating layer 15a and the thickness tb2 of the second interlayer insulating layer 15b.

Figure 4A:
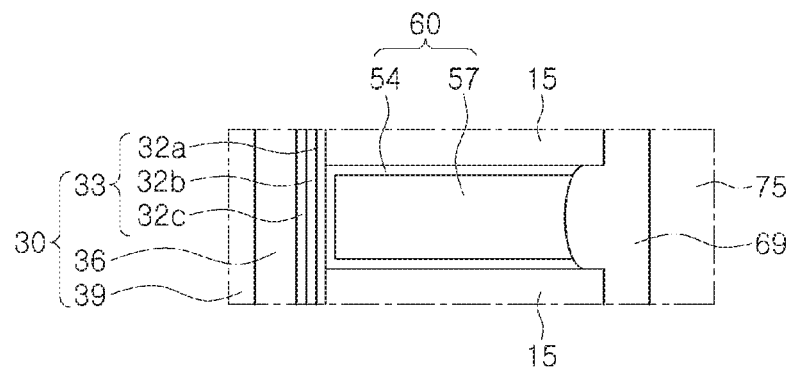
FIGS. 4A to 4C are partially enlarged views illustrating examples of a component of a semiconductor device according to some example embodiments.
Figure 4B:
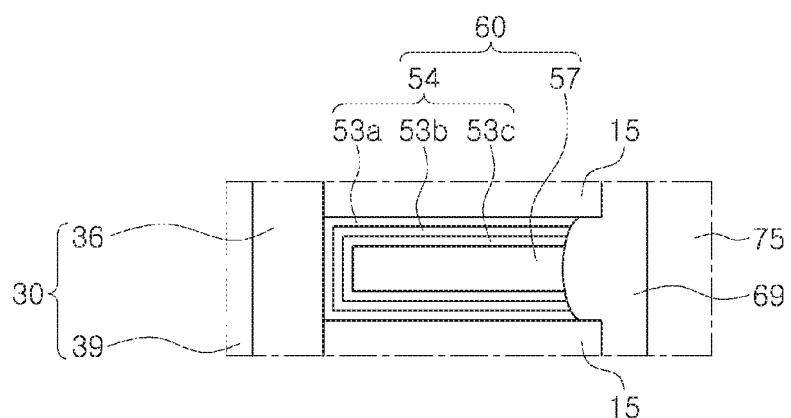
Figure 4C:
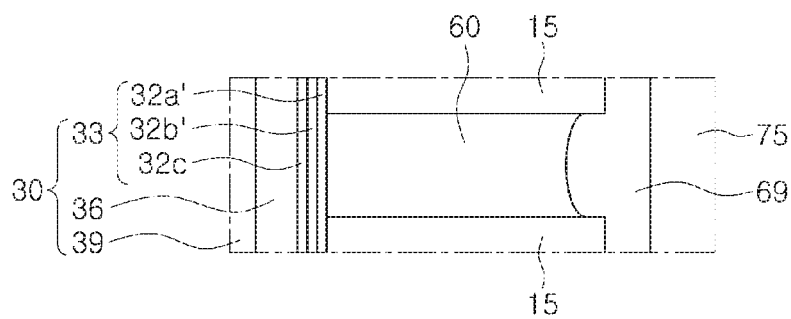

In some example embodiments, one of gates 60 and the vertical structures 30 may include a data storage layer. Examples of the gates 60 and the vertical structures 30 will be described with reference to FIGS. 4A to 4C. FIGS. 4A to 4C are partially enlarged drawings illustrating portion A of FIG. 2.

An example of the vertical structures 30 and the gates 60 will be described with reference to FIG. 4A.

With reference to FIG. 4A along with FIGS. 1 to 3, the vertical structures 30 may include the first gate dielectric structure 33, including a data storage layer 32b. The first gate dielectric structure 33 may include a blocking dielectric layer 32a close to the gates 60 and a tunnel dielectric layer 32c close to the channel layer 36. The data storage layer 32b of the first gate dielectric structure 33 may be interposed between the blocking dielectric layer 32a and the tunnel dielectric layer 32c.

The blocking dielectric layer 32a may include a silicon oxide and/or nitrogen doped silicon oxide. The data storage layer 32b may be a layer for storing data in a non-volatile memory device such as a flash memory device or the like. For example, the data storage layer 32b may be a charge trap layer for trapping a charge to store data. The data storage layer 32b may be formed of a material trapping an electron injected through the tunnel dielectric layer 32c from the channel layer 36, to be retained according to operating conditions of a memory device, or removing an electron trapped inside the data storage layer 32b. For example, the data storage layer 32b may be formed of a silicon nitride. The blocking dielectric layer 32a may be formed of a dielectric having an energy band gap greater than an energy band gap of a high dielectric, for example, a silicon oxide.

The gates 60 may include a gate electrode 57 and a second gate dielectric structure 54 interposed between the gate electrode 57 and the vertical structures 30 to be extended between the gate electrode 57 and the interlayer insulating layer 15. The second gate dielectric structure 54 of the gates 60 may be formed of a blocking dielectric layer. For example, the second gate dielectric structure 54 may be formed of a high dielectric such as a hafnium oxide and/or an aluminum oxide or the like.

A different example of the vertical structures 30 and the gates 60 will be described with reference to FIG. 4B.

With reference to FIG. 4B along with FIGS. 1 to 3, the gates 60 may include a gate electrode 57 and a gate dielectric structure 54 interposed between the gate electrode 57 and the vertical structures 30 to be extended between the gate electrode 57 and the interlayer insulating layer 15. The gate dielectric structure 54 may include a tunnel dielectric layer 53a, a blocking dielectric layer 53c, and a data storage layer 53b disposed between the tunnel dielectric layer 53a and the blocking dielectric layer 53c. The tunnel dielectric layer 53a may be close to the channel layer 36, and the blocking dielectric layer 53c may be close to the gate electrode 57.

A different example of the vertical structures 30 and the gates 60 will be described with reference to FIG. 4C.

With reference to FIG. 4C along with FIGS. 1 to 3, the gates 60 may be formed of a gate electrode. The vertical structures 30 may include a gate dielectric structure 33 disposed between the channel layer 36 and the gates 60. The gate dielectric structure 33 may include a blocking dielectric layer 32a' close to the gates 60, a tunnel dielectric layer 32c close to the channel layer 36, and a data storage layer 32b', disposed between the blocking dielectric layer 32a' and the blocking dielectric layer 32c.

With reference to FIGS. 5 to 9, modified examples of stacked units of a semiconductor device according to some example embodiments will be described. FIGS. 5 to 9 are cross sectional views illustrating modified examples of stacked units of a semiconductor device according to some example embodiments.

Figure 5:
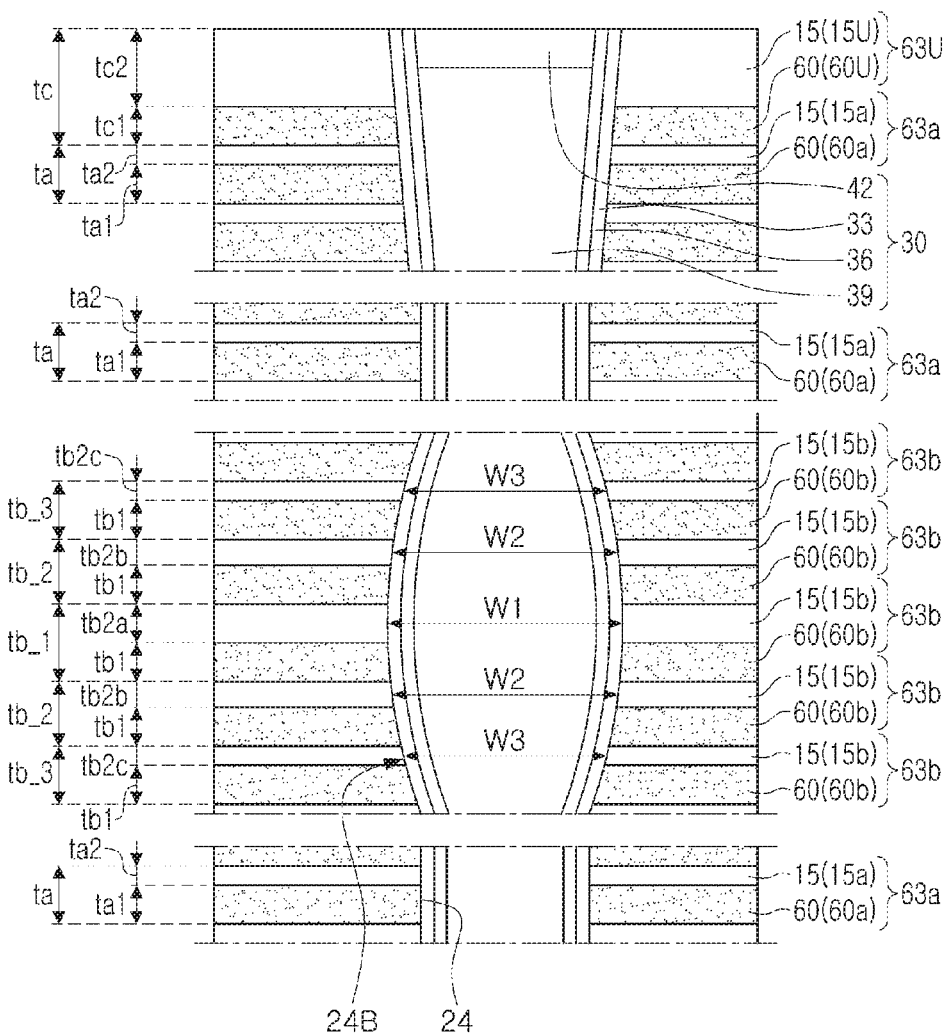
FIGS. 5 to 9 are drawing illustrating modified examples of a component of a semiconductor device according to some example embodiments, respectively.

With reference to FIG. 5 along with FIGS. 1 and 2, a modified example of stacked units of a semiconductor device according to some example embodiments will be described.

With reference to FIG. 5 along with FIGS. 1 and 2, the second stacked units 63b may include units having different thicknesses tb_1, tb_2, and tb_3. For example, second gates 60b of the second stacked units 63b may have the same thickness tb1 as the thickness ta1 of first gates 60a, and second interlayer insulating layers 15b of the second stacked units 63b may have different thicknesses tb2a, tb2b, and tb2c. The second interlayer insulating layers 15b may be disposed to have thicknesses gradually increased and then gradually decreased.

The second interlayer insulating layers 15b may have thicknesses according to the second hole region of the holes 24, in other words, a size of a width of the second hole region 24B. The second hole region 24B may be a bowing region. Thicknesses tb2a, tb2b, and tb2c of the second interlayer insulating layers 15b may be increased, as a width of the second hole region 24B is increased. For example, the second interlayer insulating layer 15b opposing a portion of the second hole region 24B having a first width W1 may have a first thickness tb2a, the second interlayer insulating layer 15b opposing the second hole region 24B having a second width W2 narrower than the first width W1 may have a second thickness tb2b thinner the first thickness tb2a, and the second interlayer insulating layer 15b opposing the second hole region 24B having a third width W3 narrower than the second width W2 may have a third thickness tb2c thinner than the second thickness tb2b.

A thinnest thickness tb2c of the second interlayer insulating layers 15b may be thicker than the thickness ta2 of the first interlayer insulating layer 15a. Among the second interlayer insulating layers 15b, a thickness tb2a of a second interlayer insulating layer opposing a portion having the first width W1, a maximum width of the second hole region 24B may be thickest. In addition, the second interlayer insulating layers 15b may have thicknesses which are gradually decreased in the order of the first thickness tb2a, the second thickness tb2b, and the third thickness tb2c, as being close to the first stacked units 63a.

Figure 6:
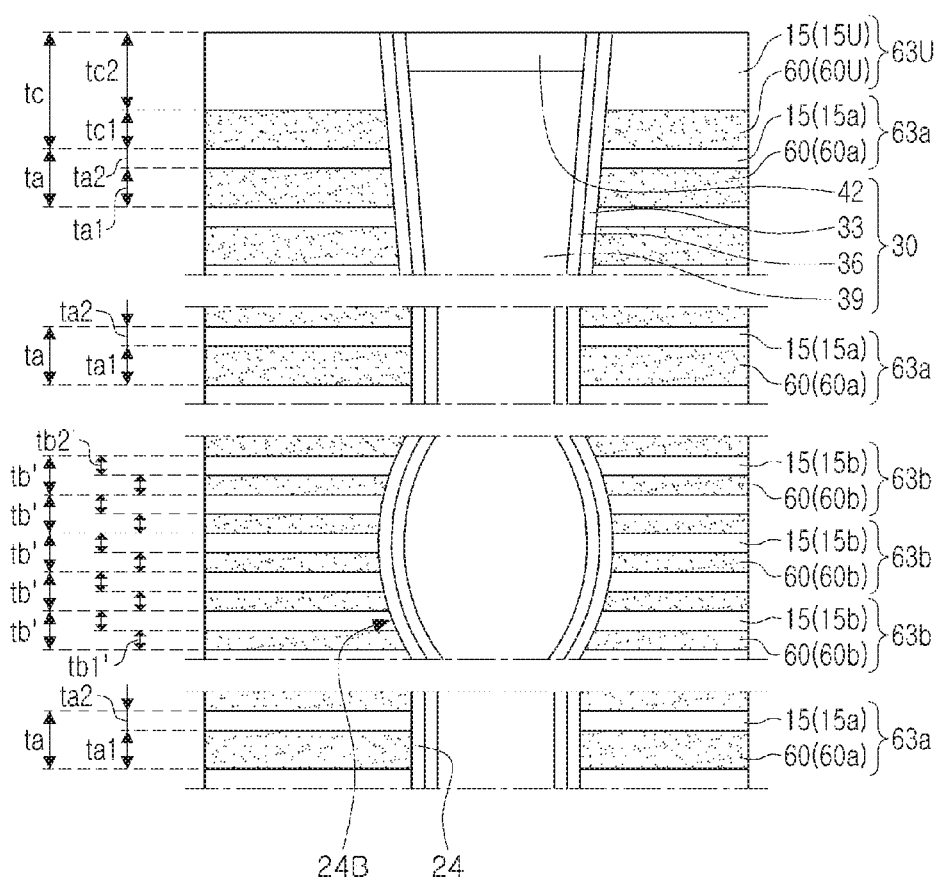

With reference to FIG. 6 along with FIGS. 1 and 2, a different modified example of stacked units of a semiconductor device according to some example embodiments will be described.

With reference to FIG. 6 along with FIGS. 1 and 2, the second stacked units 63b may have a thickness tb' thinner than the thickness to of the first stacked units 63a. The thickness ta2 of the first interlayer insulating layer 15a may be the same as a thickness tb2' of the second interlayer insulating layer 15b. A thickness tb1' of the second gate 60b may be thinner than the thickness ta1 of the first gate 60a.

Figure 7:
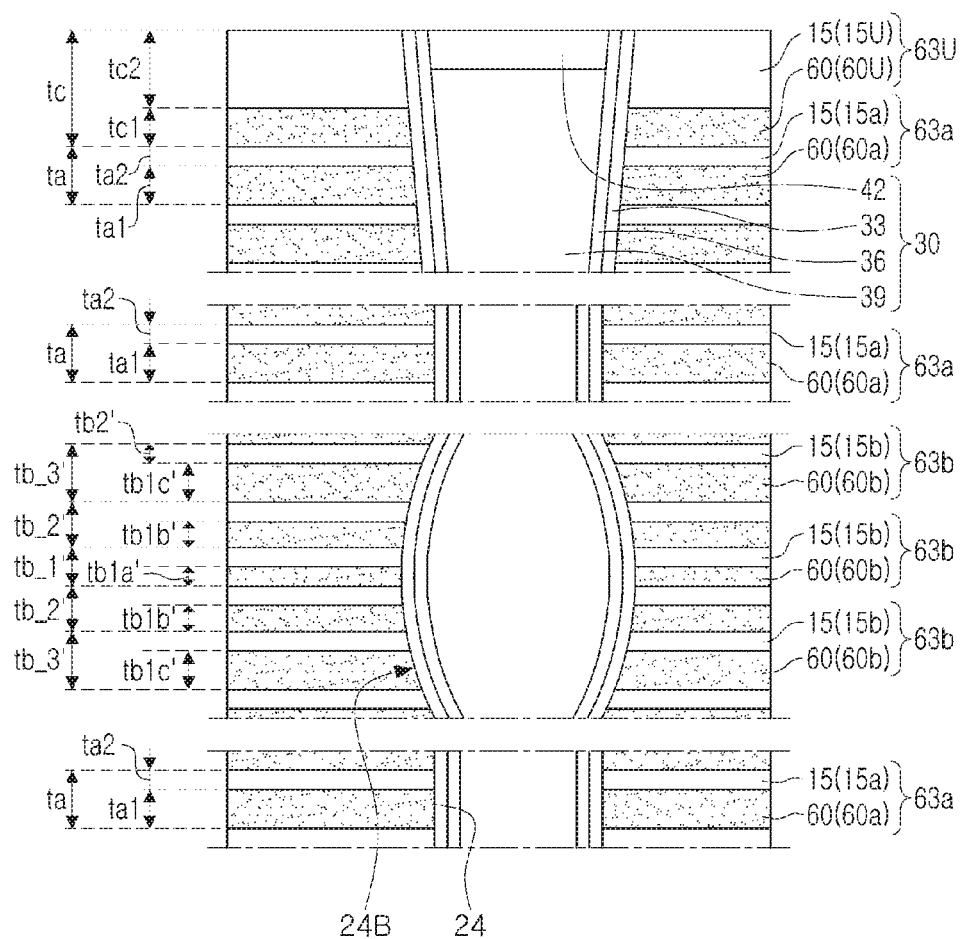

With reference to FIG. 7 along with FIGS. 1 and 2, a different modified example of stacked units of a semiconductor device according to some example embodiments will be described.

With reference to FIG. 7 along with FIGS. 1 and 2, the second stacked units 63b may include units having different thicknesses tb_1', tb_2', and tb_3'. The thickness ta2 of the first interlayer insulating layer 15a may be the same as the thickness tb2' of the second interlayer insulating layer 15b. The second gates 60b may be disposed to have different thicknesses tb1a', tb1b', and tb1c'. For example, the second gates 60b may be disposed to have thicknesses gradually decreased and then gradually increased.

Figure 8:
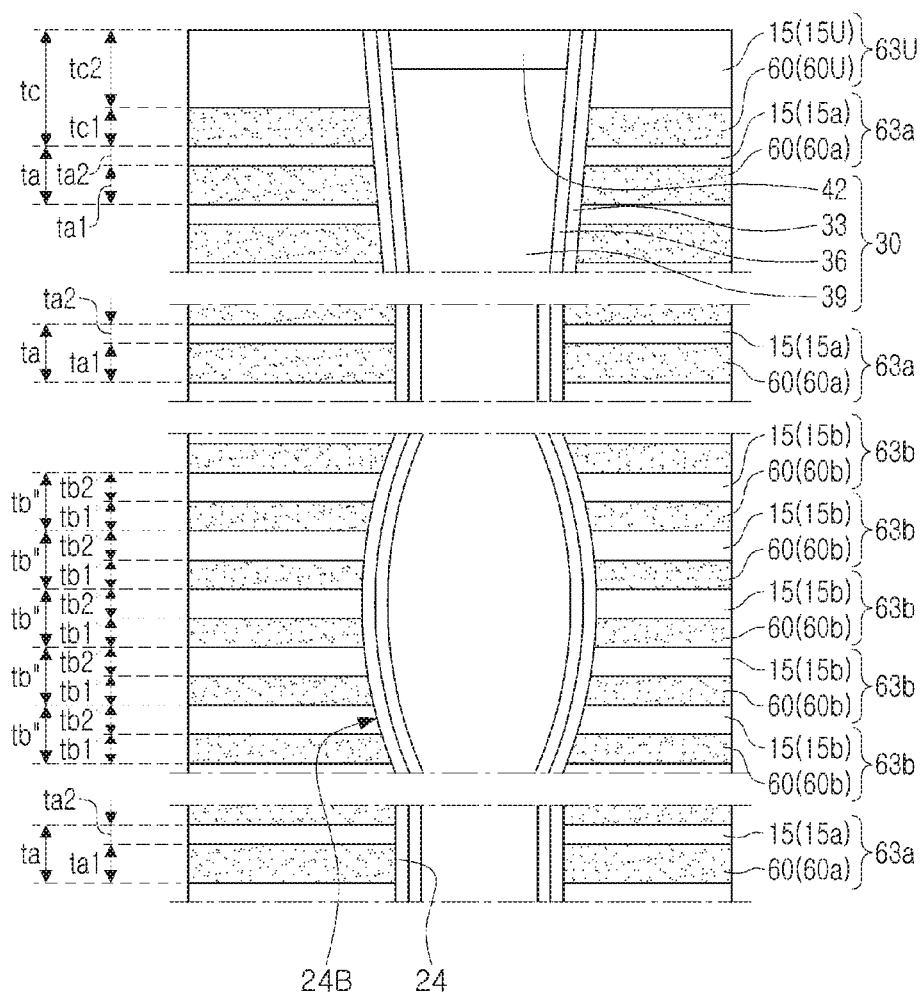

With reference to FIG. 8 along with FIGS. 1 and 2, a different modified example of stacked units of a semiconductor device according to some example embodiments will be described.

With reference to FIG. 8 along with FIGS. 1 and 2, a thickness tb1" of the second gate 60b may be thinner than the thickness ta1 of the first gate 60a, and a thickness tb2" of the second interlayer insulating layer 15b may be thicker than the thickness ta2 of the first interlayer insulating layer 15a. Thus, a thickness tb" of each of the second stacked units 63b may be the same as or similar to the thickness to of each of the first stacked units 63a.

Figure 9:
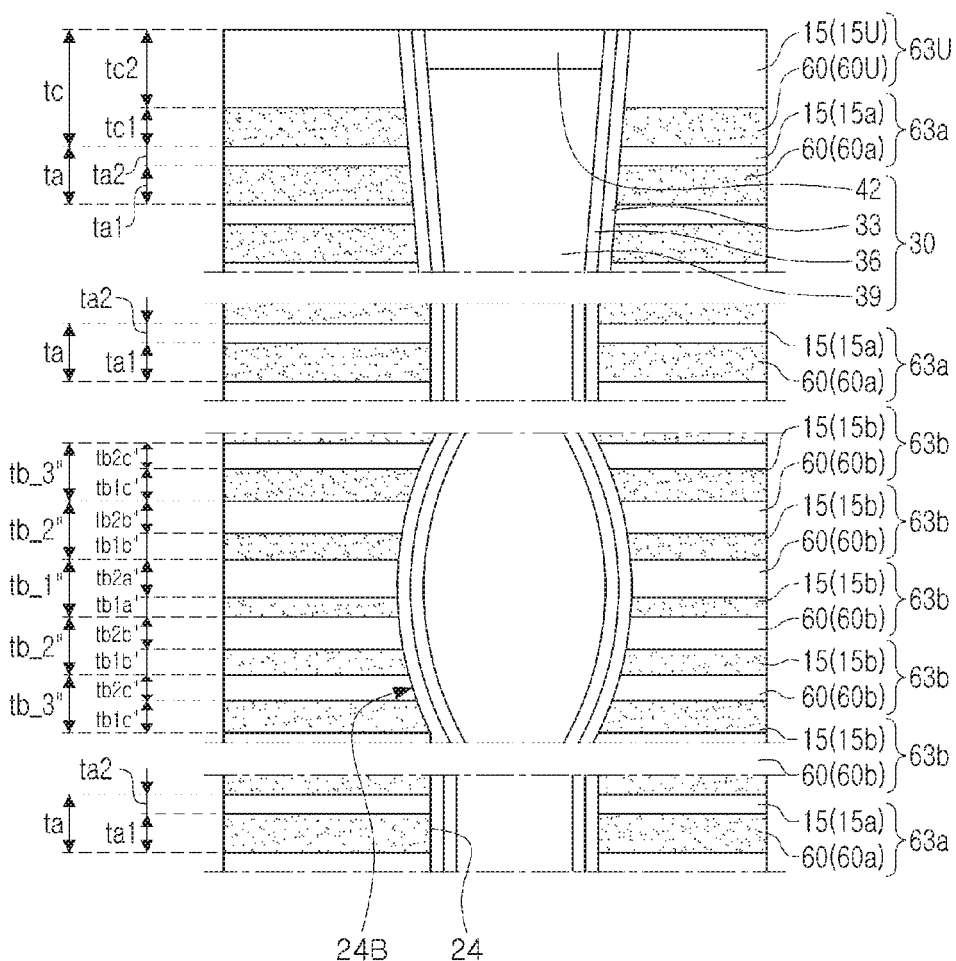

With reference to FIG. 9 along with FIGS. 1 and 2, a different modified example of stacked units of a semiconductor device according to some example embodiments will be described.

With reference to FIG. 9 along with FIGS. 1 and 2, thicknesses tb1a", tb1b", and tb1c" of the second gates 60b may be decreased as a width of the second hole region 24B is increased, and thicknesses tb2a", tb2b", of tb2c" of the second interlayer insulating layers 15b may be increased as a width of the second hole region 24B is increased. For example, the second gates 60b may be formed to have a minimum thickness tb1a" at a part having a maximum width of the second hole region 24B, and the second interlayer insulating layers 15b may be formed to have a maximum thickness tb2a" at a portion having a maximum width of the second hole region 24B.

In some example embodiments, the second hole region of the holes 24, in other words, the second hole region 24B, may be formed in one region of the stacked structure 66, but example embodiments are not limited thereto. For example, each of the holes 24 may be modified to have a plurality of bowing regions vertically spaced apart from each other. Modified holes will be described with reference to FIG. 10, which is a cross sectional view illustrating a region along line I-I' of FIG. 1.

Figure 10:
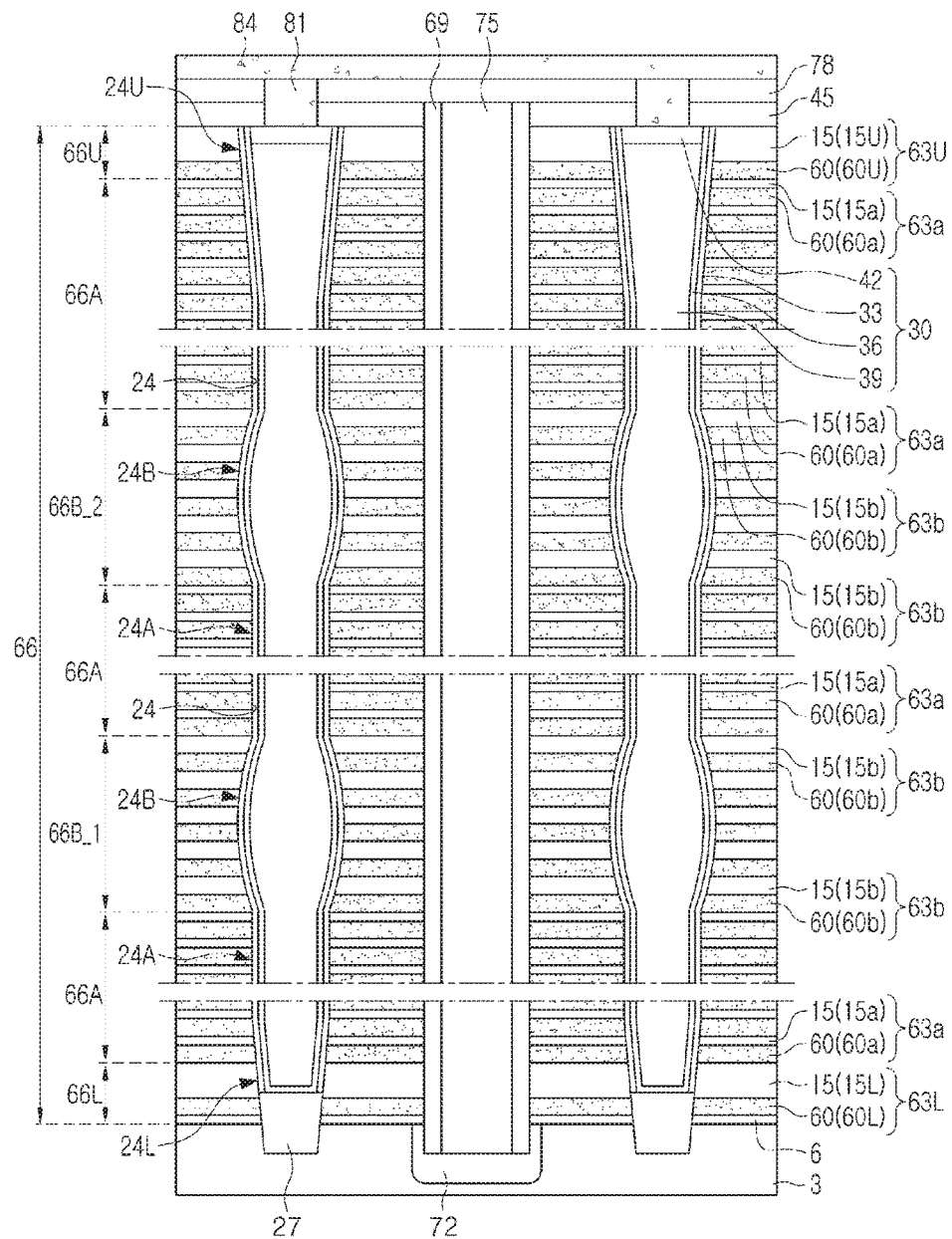
FIG. 10 is a cross sectional view illustrating a modified example of a semiconductor device according to some example embodiments.

With reference to FIGS. 1 and 10, second stacked regions 66B_1 and 66B_2, disposed between the first stacked regions 66A of the stacked structure 66 and spaced apart from each other, may be provided. A second stacked region 66B_2, located in an upper portion of the stacked structure, of the second stacked regions 66B_1 and 66B_2, may be close to an upper surface of the stacked structure 66, and a second stacked region 66B_1, located in a lower portion of the stacked structure, may be close to a lower surface of the stacked structure 66.

In some example embodiments, the second stacked regions 66B_1 and 66B_2 may have the same structure or the same shape as that of one of the second stacked regions 66B described with reference to FIGS. 2 to 9.

Among the holes 24 passing through the stacked structure 66, a hole passing through the second stacked regions 66B_1 and 66B_2 may be formed of second hole regions 24B. Thus, the holes 24 may include the second hole regions 24B vertically spaced apart from each other. A vertical structure 30 may be disposed inside the holes 24. The vertical structure 30 may correspond to the vertical structure 30 described with reference to FIGS. 2 to 9.

A semiconductor device according to some example embodiments may be a NAND flash memory device. For example, the lower gate 60L formed inside the lower stacked region 66L may include a ground select gate electrode or a ground select gate line of a NAND flash memory device, and the upper gate 60U formed inside the upper stacked region 66U may include a string select gate electrode or a string select gate line of a NAND flash memory device. The first gate 60a formed inside the first stacked region 66A and the second gate 60b formed inside the second stacked regions 66B may include memory cell gate electrodes or word lines of a NAND flash memory device. The conductive line 84, electrically connected to the vertical structures 30, may be a bit line of a NAND flash memory device. One of the gates 60 and the vertical structures 30 may include a layer for storing data, and the vertical structures 30 may include a channel layer.

In some example embodiments, the second hole region 24B of the holes 24 opposing the second gates 60b may have a bowed shape, or be a bowing region. Sides of the vertical structures 30 formed inside the second hole region 24B having the bowed shape may have a shape convex outwardly. Thus, as the second stacked units 63b opposing concave parts of the vertical structures 30 are formed as described with reference to FIGS. 1 to 9, the second hole region 24B of the holes 24 may be formed to have a substantially circular shape, thereby improving roughness of a side wall of the second hole region 24B.

Figure 11:
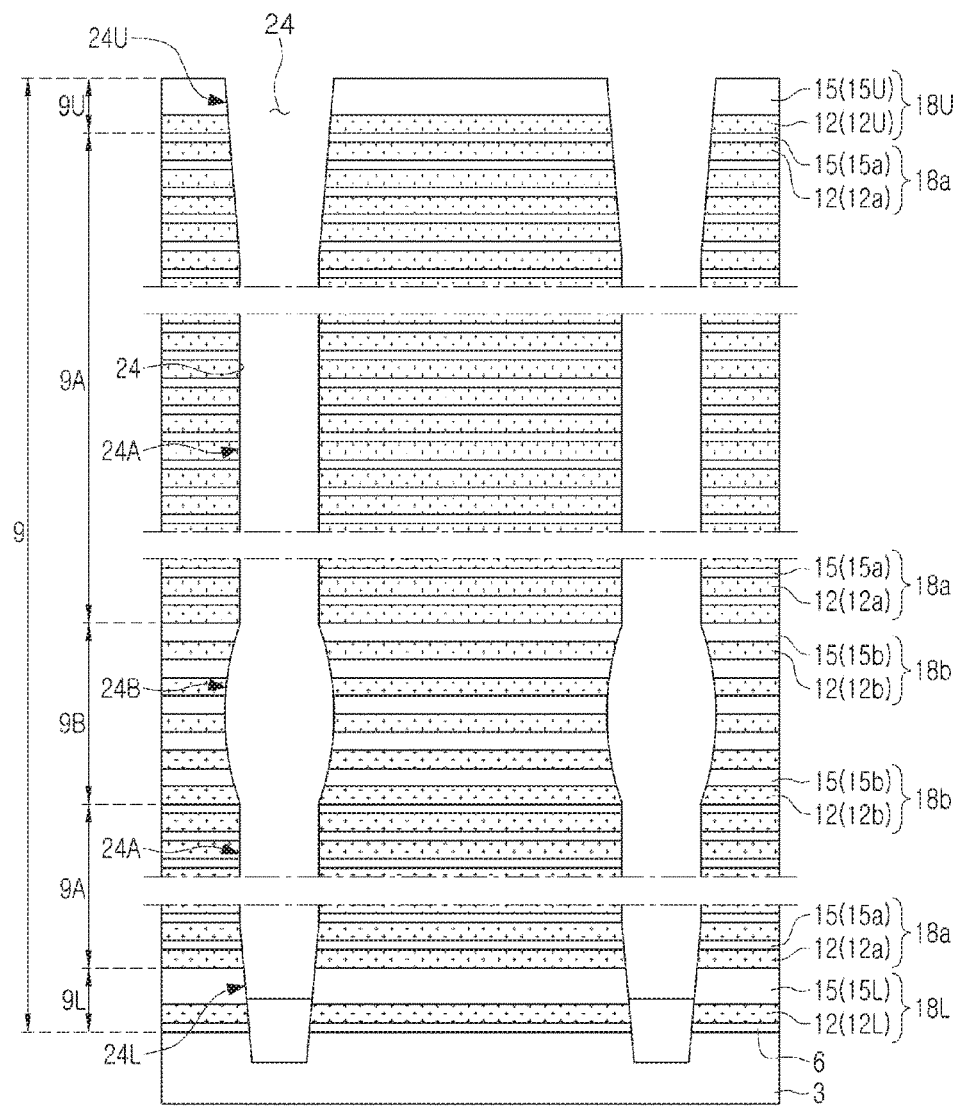
FIGS. 11 to 17 are cross sectional views illustrating a method of forming a semiconductor device according to some example embodiments.

With reference to FIGS. 11 to 17, an example of a method of forming a semiconductor device according to some example embodiments will be described. FIG. 11 and FIGS.

13 to 17 are cross sectional views illustrating a region taken along line I-I' of FIG. 1, and each of FIGS. 12A to 12F is a cross sectional view illustrating various examples of a mold structure according to example embodiments.

With reference to FIGS. 1 and 11, a lower insulating layer 6 may be formed on a substrate 3. The substrate 3 may be a semiconductor substrate. The lower insulating layer 6 may be formed of a silicon oxide.

A mold structure 9 may be formed on the lower insulating layer 6. The mold structure 9 may include a lower mold region 9L, an upper mold region 9U, first mold regions 9A disposed between the lower mold region 9L and the upper mold region 9U, and a second mold region 9B disposed between the first mold regions 9A.

The mold structure 9 may be formed of mold units arranged in a direction perpendicular to the substrate 3. Each of the mold units may include a sacrificial layer 12 and an interlayer insulating layer 15 disposed on the sacrificial layer 12. The sacrificial layer 12 may be formed of a material having an etching selectivity compared to the interlayer insulating layer 15. For example, in some example embodiments, the sacrificial layer 12 may be formed of silicon nitride or silicon oxynitride and the interlayer insulating layer 15 may be formed of silicon oxide. However, example embodiments are not limited thereto.

The mold units of the mold structure 9 may include a lower mold unit 18L formed inside the lower mold region 9L, an upper mold unit 18U formed inside the upper mold region 9U, first mold units 18a formed inside the first mold regions 9A, and second mold units 18b formed inside the second mold region 9B.

The lower mold unit 18L may include a lower sacrificial layer 12L and a lower interlayer insulating layer 15L disposed on the lower sacrificial layer 12L, and the upper mold unit 18U may include an upper sacrificial layer 12U and an upper interlayer insulating layer 15U disposed on the upper sacrificial layer 12U. Each of the first mold units 18a may include a first sacrificial layer 12a and a first interlayer insulating layer 15a disposed on the first sacrificial layer 12a, and each of the second mold units 18b may include a second sacrificial layer 12b and a second interlayer insulating layer 15b disposed on the second sacrificial layer 12b.

A ratio of a thickness of the second interlayer insulating layer 15b and a thickness of the second sacrificial layer 12b, of the second mold units 18b, may be different from a ratio of a thickness of the first interlayer insulating layer 15a and a thickness of the first sacrificial layer 12a, of the first mold units 18a. For example, the ratio of a thickness of the second interlayer insulating layer 15b with respect to a thickness of the second sacrificial layer 12b, of the second mold units 18b, may be greater than the ratio of a thickness of the first interlayer insulating layer 15a with respect to a thickness of the first sacrificial layer 12a, of the first mold units 18a.

A mask may be formed on the mold structure 9. An etching process of etching the mold structure 9 using the mask as an etching mask is performed to form holes 24 passing through the mold structure 9. The etching process may be a dry etching process using plasma. After the holes 24 are formed, the mask may be removed from the mold structure.

Each of the holes 24 may include an upper hole region 24U passing through the upper mold region 9U, a lower hole region 24L passing through the lower mold region 9L to be extended inside the substrate 3, first hole regions 24A passing through the first mold regions 9A, and a second hole region 24B passing through the second mold region 9B. The second hole region 24B may have a bowing region or a bowing structure.

To improve integration of a semiconductor device, a height of the mold structure 9 may be increased. The holes 24 passing through the mold structure 9, with an increased height as described above, may have a high aspect ratio. The etching process for forming the holes 24 having the high aspect ratio described above may be a dry etching process using high bias power to improve etch ion energy. When the holes 24 are formed using the dry etching process described above, while ions incident inside the holes 24 to etch the mold structure 9 collide with a side wall inside the holes 24, the second hole region 24B may be formed inside the holes 24. A location of the second hole region 24B may be determined according to an aspect ratio of the holes 24 and a location of an ion particle reaching a side wall inside a hole in the etching process. For example, the second hole region 24B of the holes 24 may be formed to be close to a lower surface of the mold structure 9, than to an upper surface thereof. In a manner different from the case described above, the second hole region 24B of the holes 24 may be formed in two locations inside a single hole, as described with reference to FIG. 10.

Although the second hole region 24B inside the holes 24 may allow a morphology defect of the holes 24 to occur, the inventors of inventive concepts find that a morphology defect of the holes 24 may be limited and/or prevented as the second mold units 18b are formed in a region, in which the second hole region 24B of the holes 24 is formed. The morphology defect may include a case in which the second hole region, in other words, the second hole region 24B is not formed in a desired shape (e.g., a circular shape). For example, the morphology defect may refer to a case in which the second hole region 24B is formed to have a distorted shape or an elliptical shape, outside of an allowable error range.

Thus, according to some example embodiments, the second hole region 24B of the holes 24 may be formed in a part passing through the second mold units 18b, and the second mold units 18b may limit and/or prevent the occurrence of a morphology defect, which may occur due to the second hole region 24B of the holes 24. Thus, an erase/program speed defect of memory cells, which may occur due to the morphology defect, may be limited and/or prevented.

Various examples of the second mold units 18b will be described with reference to FIGS. 12A to 12F.

Figure 12A:
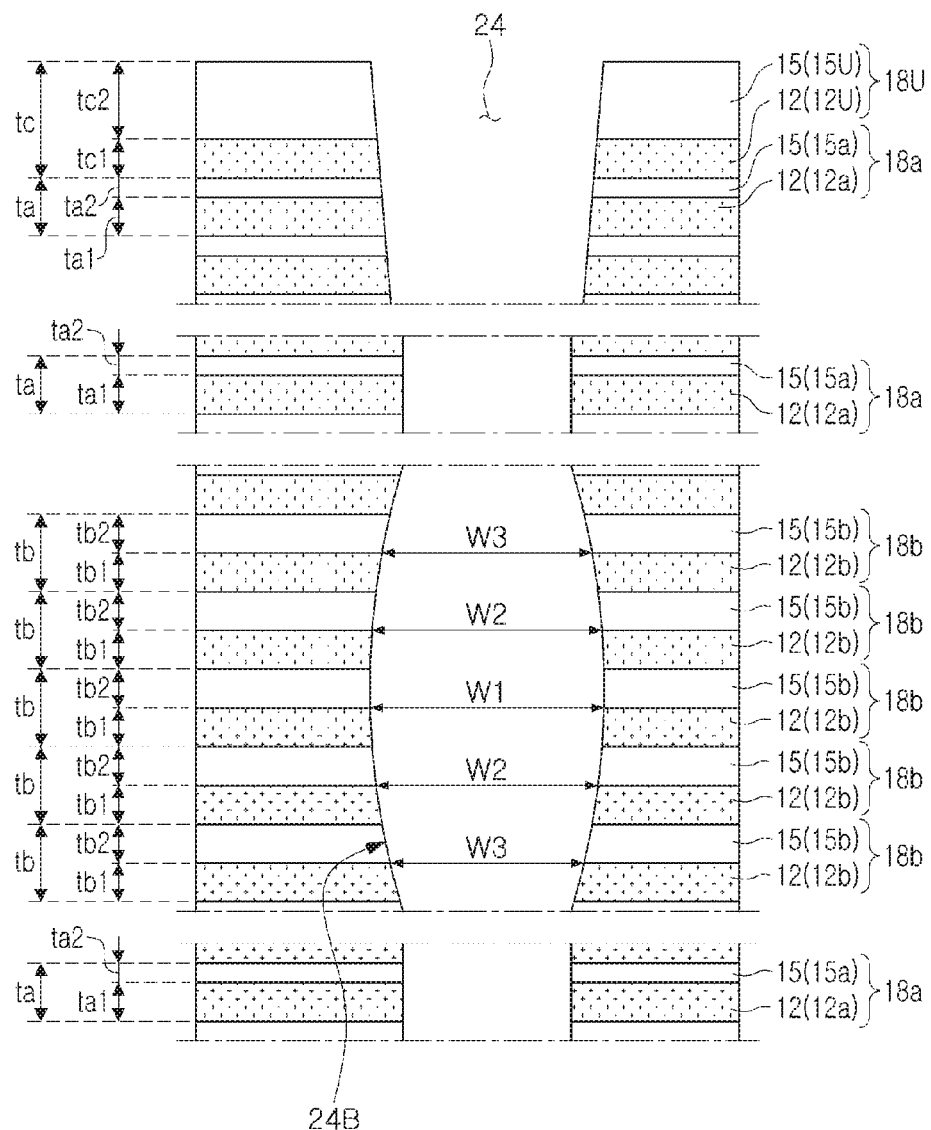

With reference to FIGS. 11 and 12A, the second mold units 18b may be formed to have the same thickness as that of the second stacked units 63b described in FIG. 3. For example, sacrificial layers 12b and the second interlayer insulating layers 15b of the second mold units 18b may be formed to have the same thickness as that of the second gates 60b and the second interlayer insulating layers 15b of the second stacked units 63b described with reference to FIG. 3, respectively.

Figure 12B:
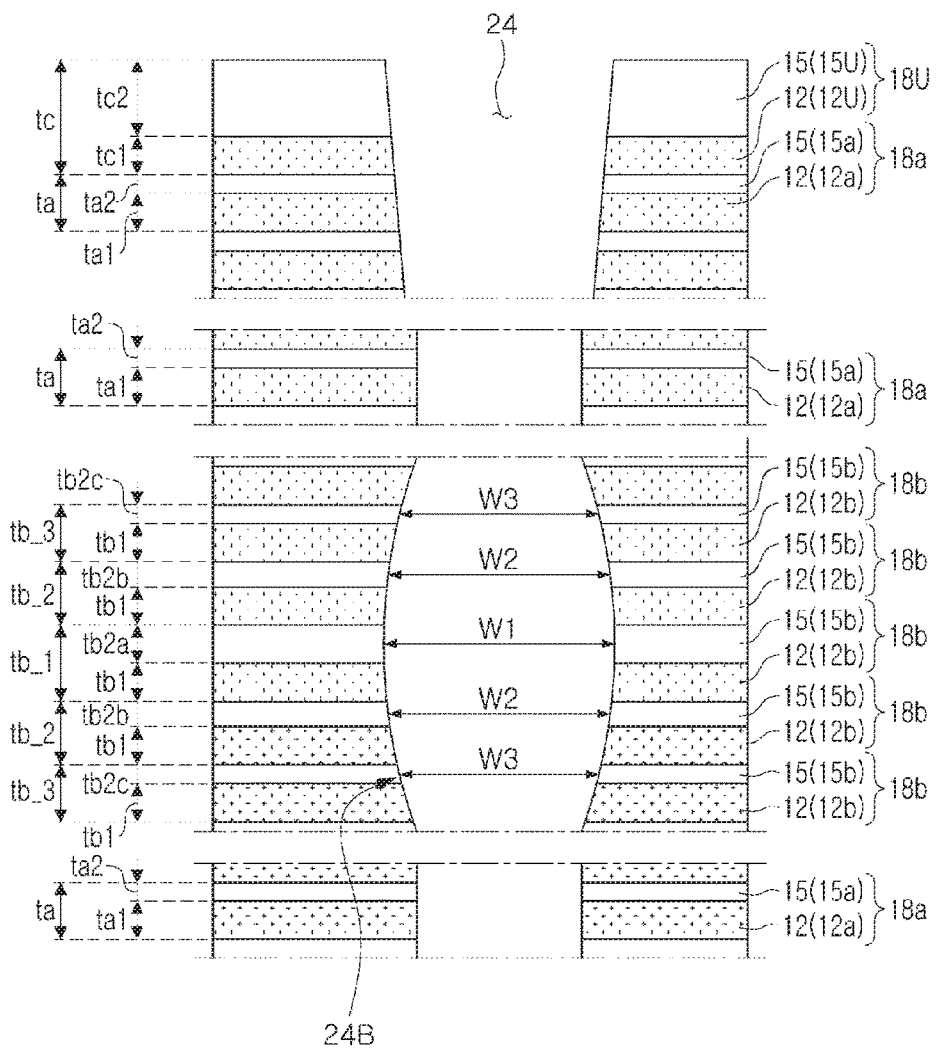

With reference to FIGS. 11 and 12B, the sacrificial layers 12b and the second interlayer insulating layers 15b of the second mold units 18b may be formed to have the same thickness as that of the second gates 60b and the second interlayer insulating layers 15b of the second stacked units 63b described with reference to FIG. 5, respectively.

Figure 12C:
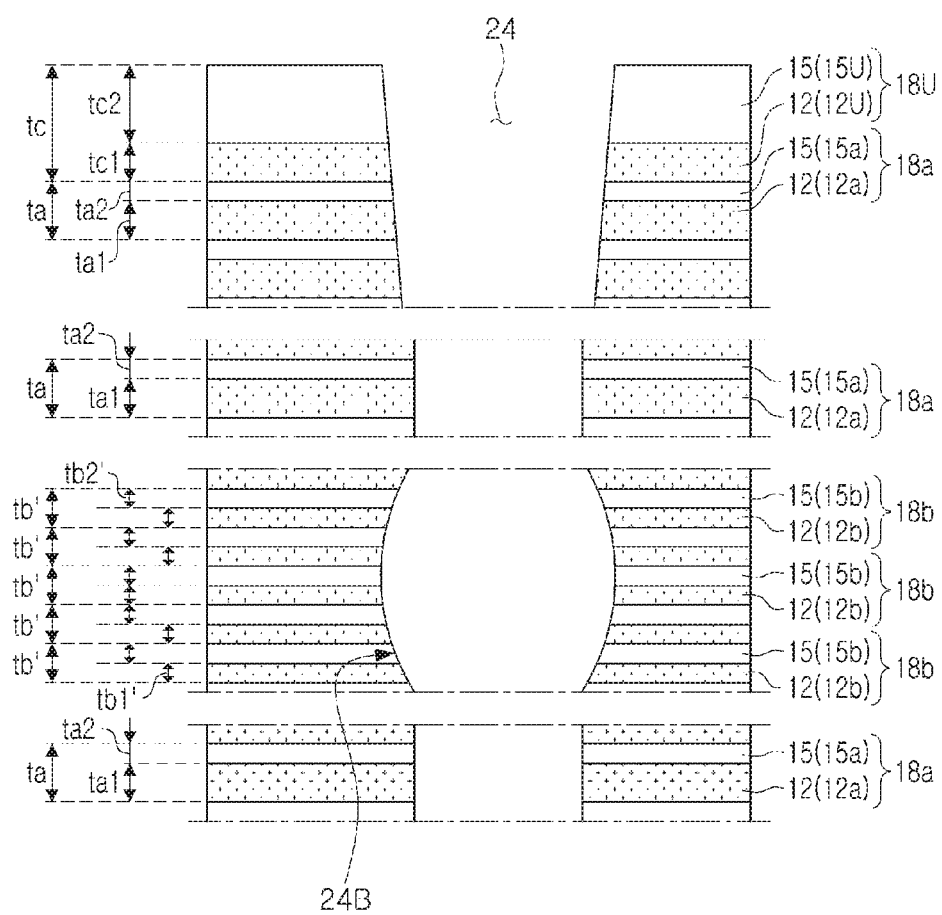

With reference to FIGS. 11 and 12C, the sacrificial layers 12b and the second interlayer insulating layers 15b of the second mold units 18b may be formed to have the same thickness as that of the second gates 60b and the second interlayer insulating layers 15b of the second stacked units 63b described with reference to FIG. 6, respectively.

Figure 12D:
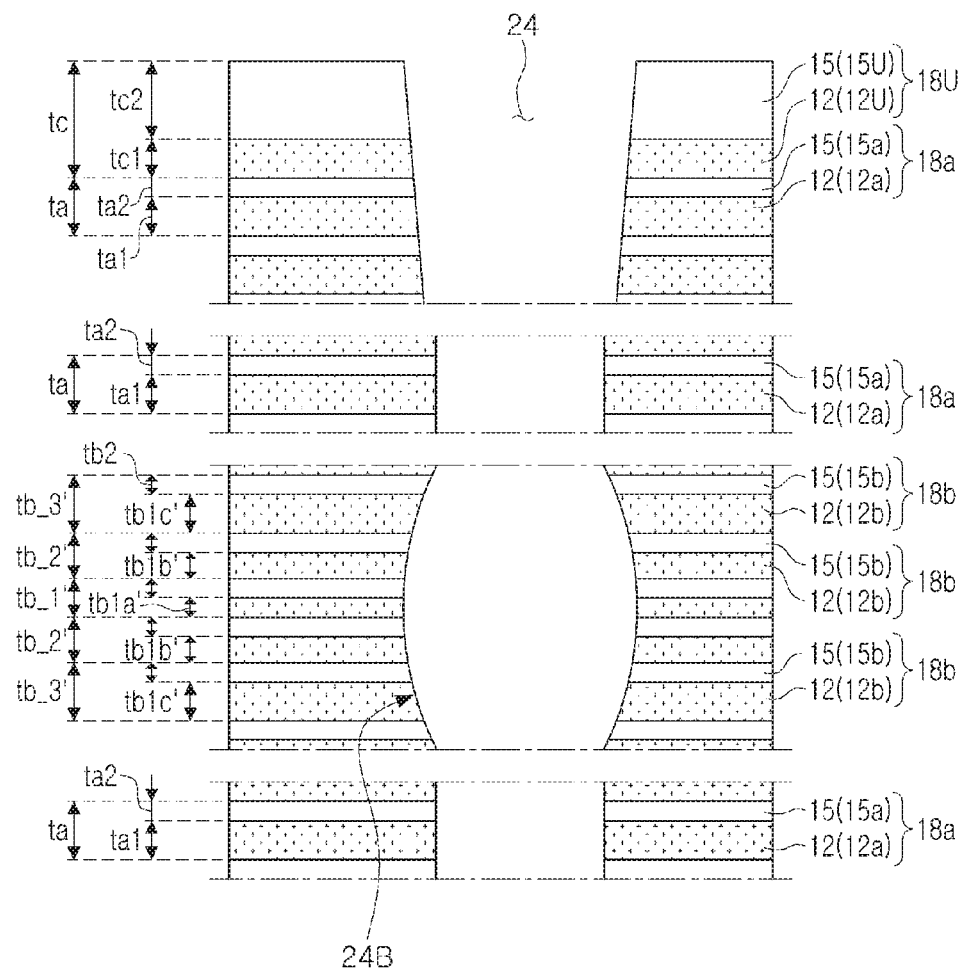

With reference to FIGS. 11 and 12D, the sacrificial layers 12b and the second interlayer insulating layers 15b of the second mold units 18b may be formed to have the same thickness as that of the second gates 60b and the second interlayer insulating layers 15b of the second stacked units 63b described with reference to FIG. 7, respectively.

Figure 12E:
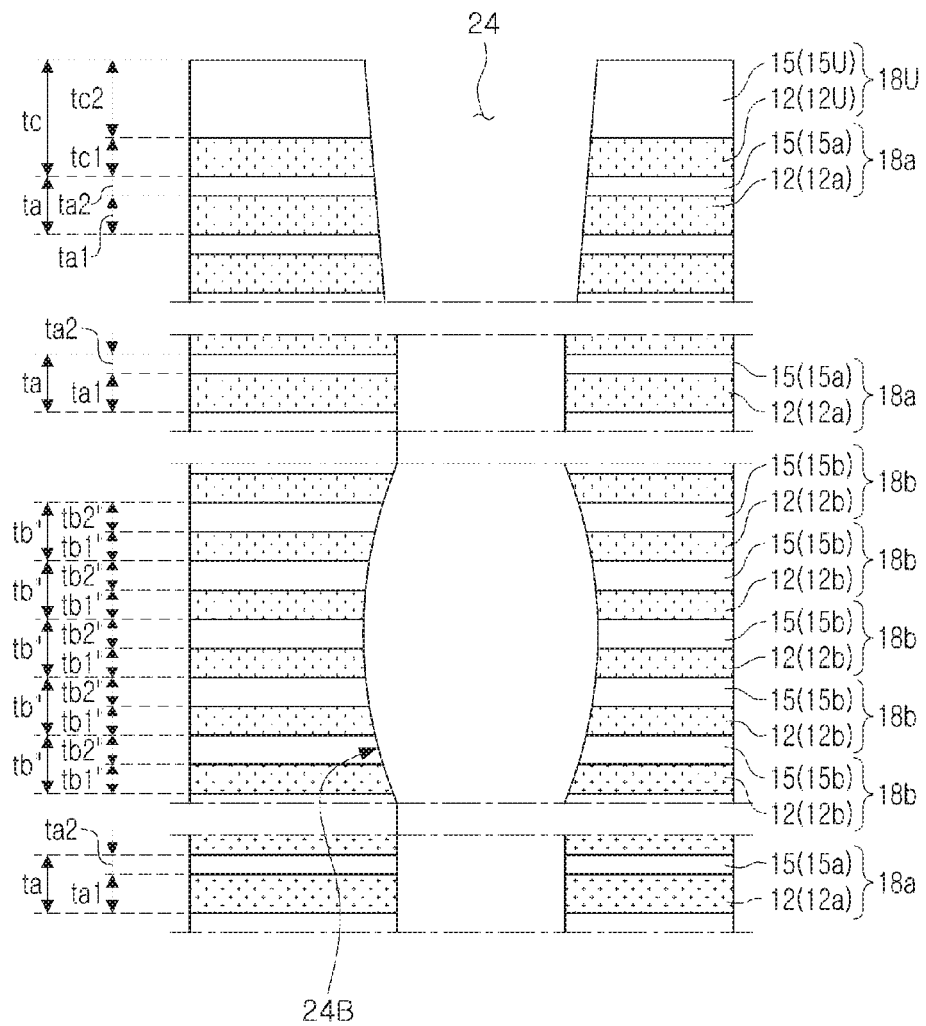

With reference to FIGS. 11 and 12E, the sacrificial layers 12b and the second interlayer insulating layers 15b of the second mold units 18b may be formed to have the same thickness as that of the second gates 60b and the second interlayer insulating layers 15b of the second stacked units 63b described with reference to FIG. 8, respectively.

Figure 12F:
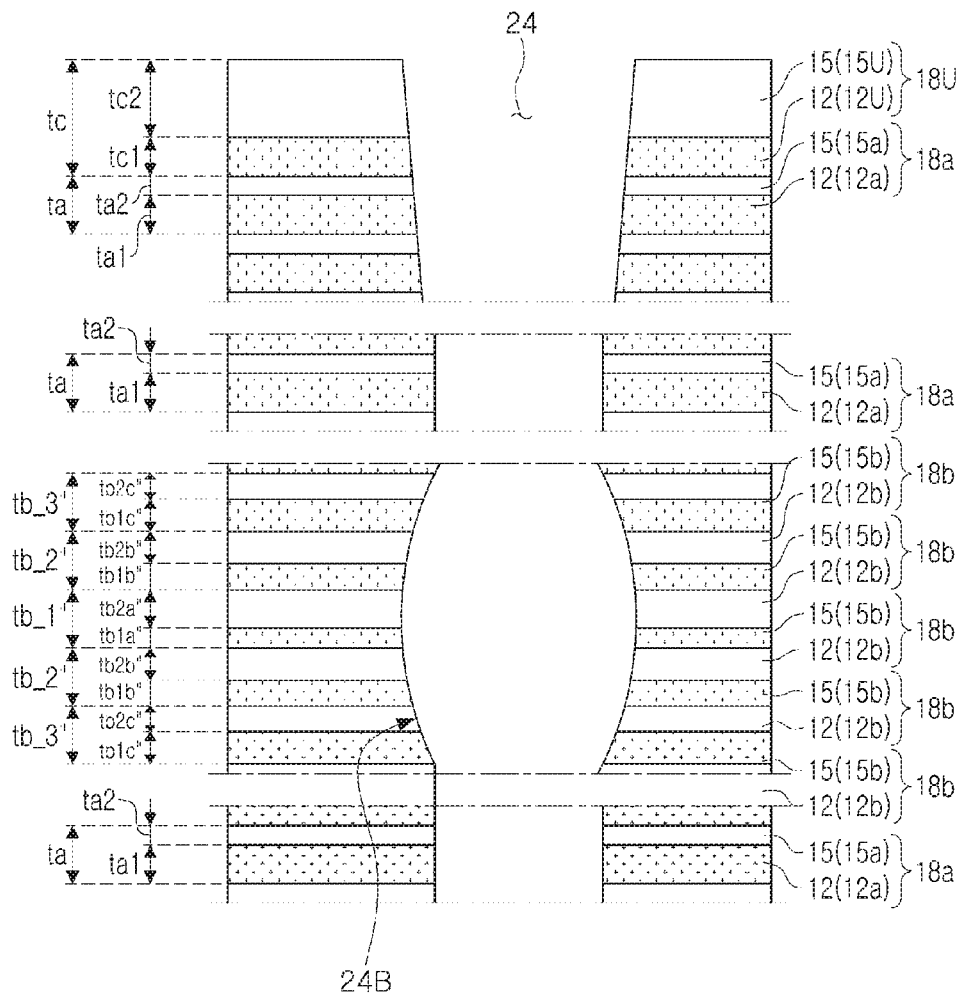

With reference to FIGS. 11 and 12F, the sacrificial layers 12b and the second interlayer insulating layers 15b of the second mold units 18b may be formed to have the same thickness as that of the second gates 60b and the second interlayer insulating layers 15b of the second stacked units 63b described with reference to FIG. 9, respectively.

Figure 13:
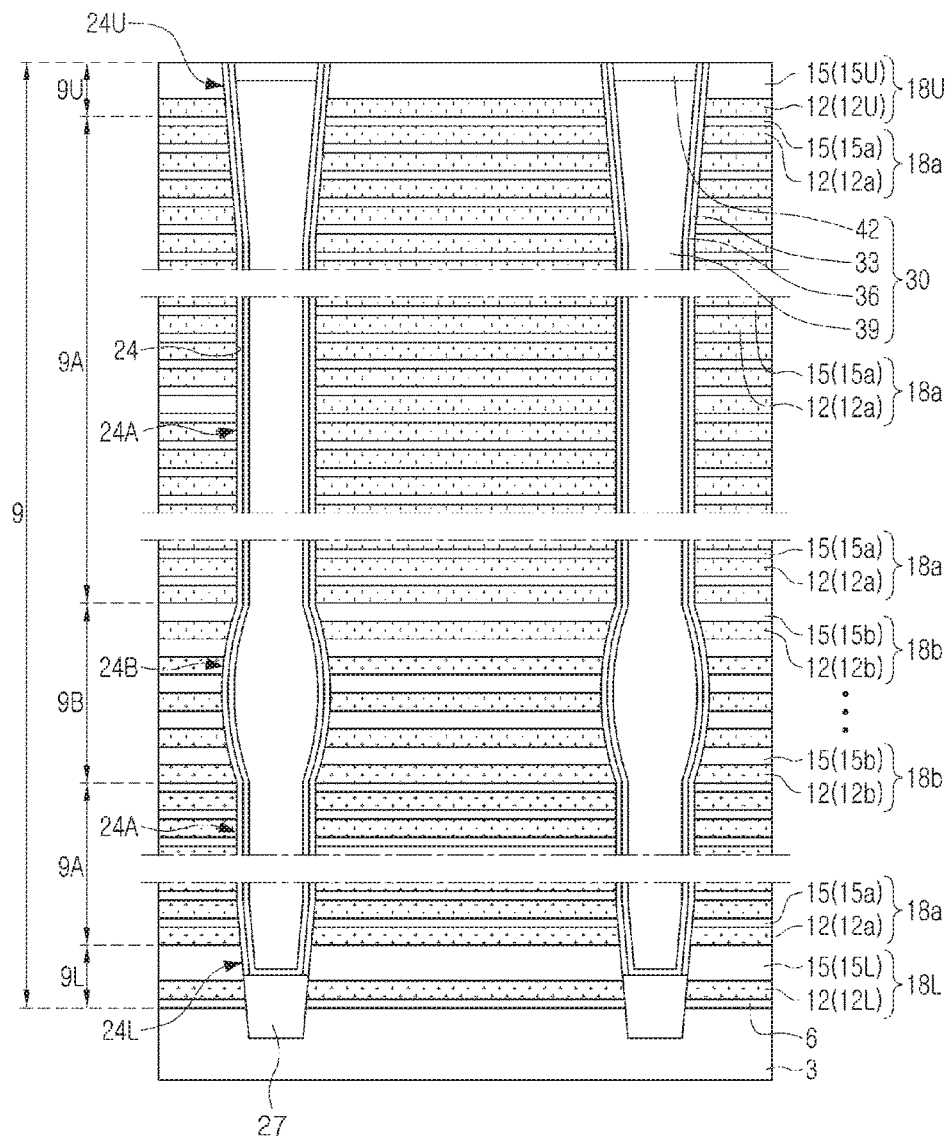

With reference to FIGS. 1 and 13, semiconductor patterns 27 may be formed on the substrate 3 exposed by the holes 24. Forming the semiconductor patterns 27 may include forming an epitaxial layer using an SEG process. The semiconductor patterns 27 may be formed of single-crystal silicon. The semiconductor patterns 27 inside the holes 24 may oppose the lower sacrificial layer 12L. An upper surface of the semiconductor patterns 27 may be formed on a level lower than first sacrificial layers 12a.

The vertical structures 30 may be formed inside the holes 24. Forming the vertical structures 30 may include forming a channel layer 36 connected to a semiconductor pattern 27, while covering an inner wall of the holes 24, forming a core pattern 39 partially filling the holes 24 therewith on the channel layer 36, forming a pad 42 disposed on a substrate having the core pattern 39, and flattening the pad 42 and the channel layer 36 until the upper interlayer insulating layer 15U is exposed. The channel layer 36 may be formed of a semiconductor layer such as silicon or the like, the core pattern 39 may be formed of an insulating material such as a silicon oxide or the like, and the pad 42 may be formed of doped polysilicon.

In an example, forming the vertical structures 30 may further include forming a first gate dielectric structure 33 disposed on a side wall of the holes 24 before the channel layer 36 is formed.

Figure 14:
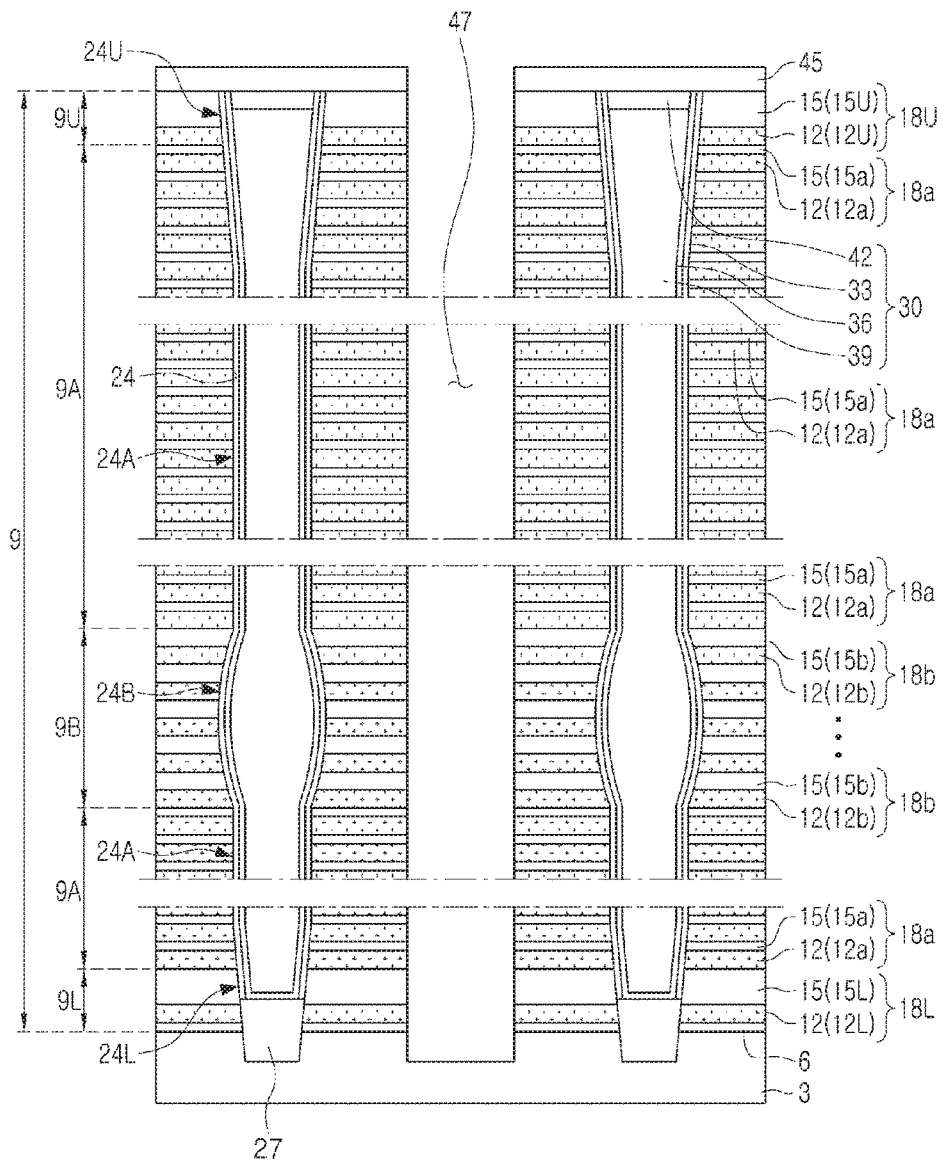

With reference to FIGS. 1 and 14, an upper insulating layer 45 covering the mold structure 9 and the vertical structure 30 may be formed. The upper insulating layer 45 may be formed of a silicon oxide. A separation opening 47 passing through the upper insulating layer 45 and the mold structure 9 may be formed. The separation opening 47 may intersect the mold structure 9. The separation opening 47 may expose sacrificial layers 12 of the mold structure 9 while exposing the substrate 3.

Figure 15:
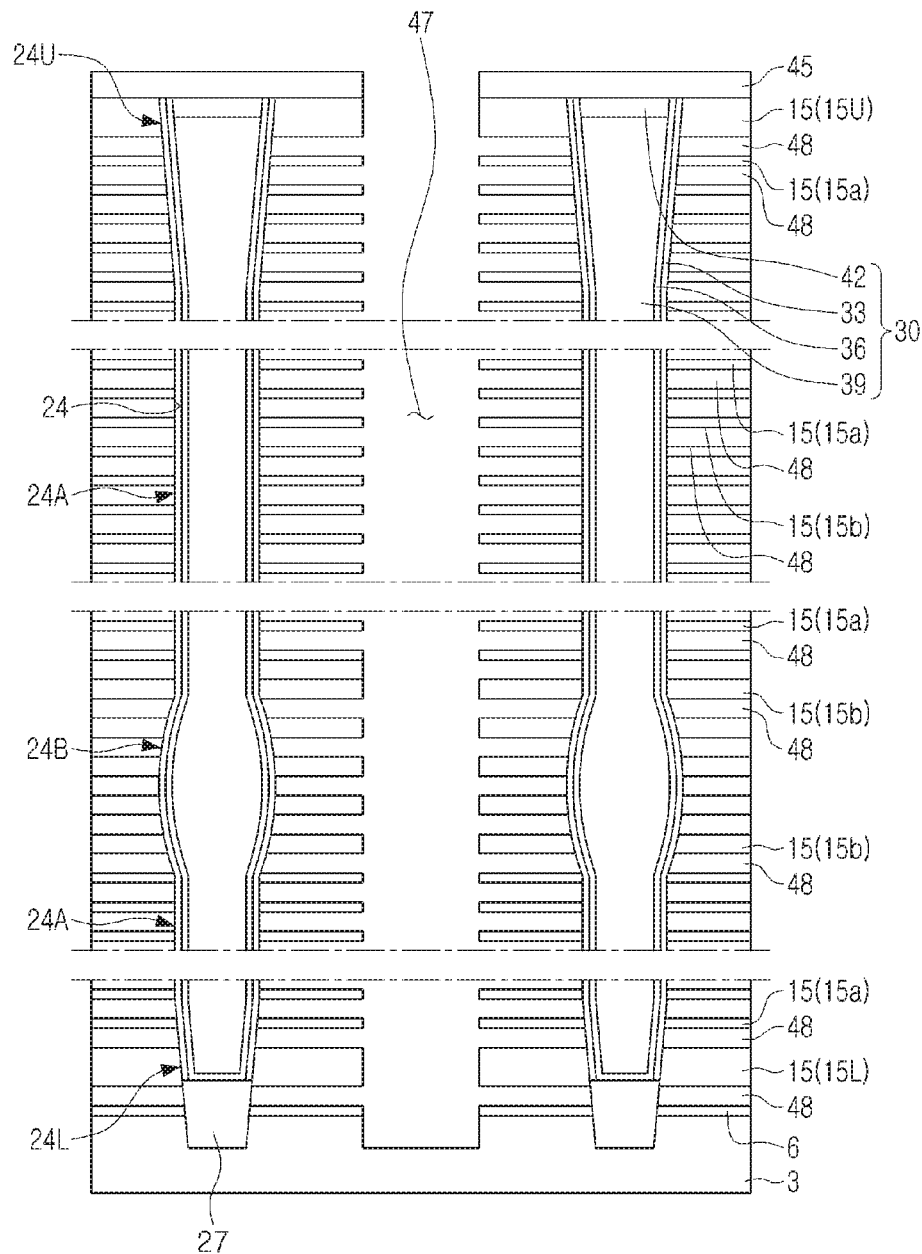

With reference to FIGS. 1 and 15, the sacrificial layers 12 exposed by the separation opening 47 are removed to form empty spaces 48. The empty spaces 48 may expose sides of the vertical structures 30.

Figure 16:
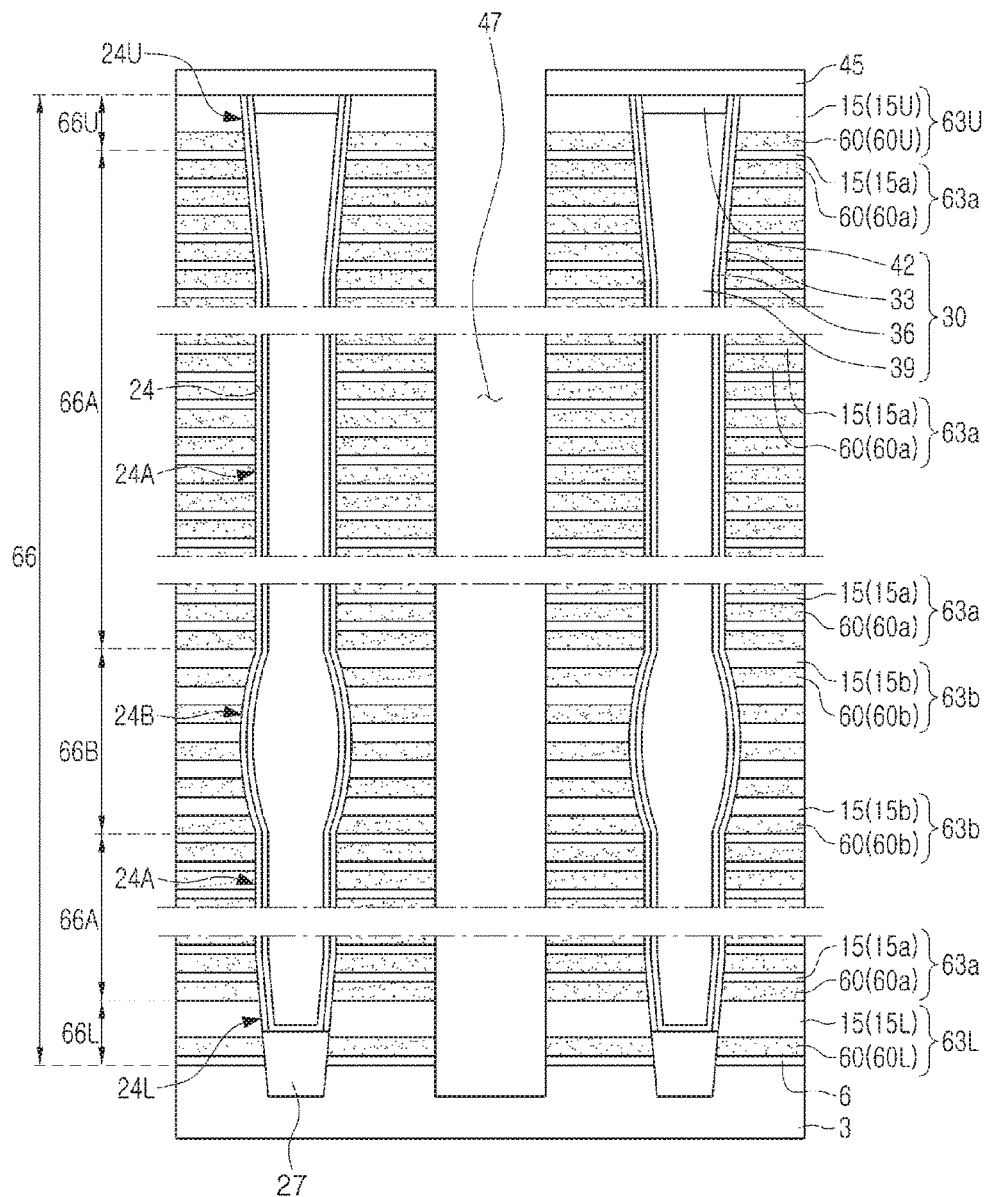

With reference to FIGS. 1 and 16, gates 60, with which the empty spaces 48 are filled, may be formed. The gates 60 may be the same as the gates 60 described with reference to FIGS. 4A to 4C, so detailed descriptions of the gates 60 will be omitted here. In addition, the gates 60 and interlayer insulating layers 15 may form the stacked structure 66, described with reference to FIGS. 1 to 3. The stacked structure 66 is described with reference to FIGS. 1 and 2, so detailed descriptions of the stacked structure 66 are omitted here.

Figure 17:
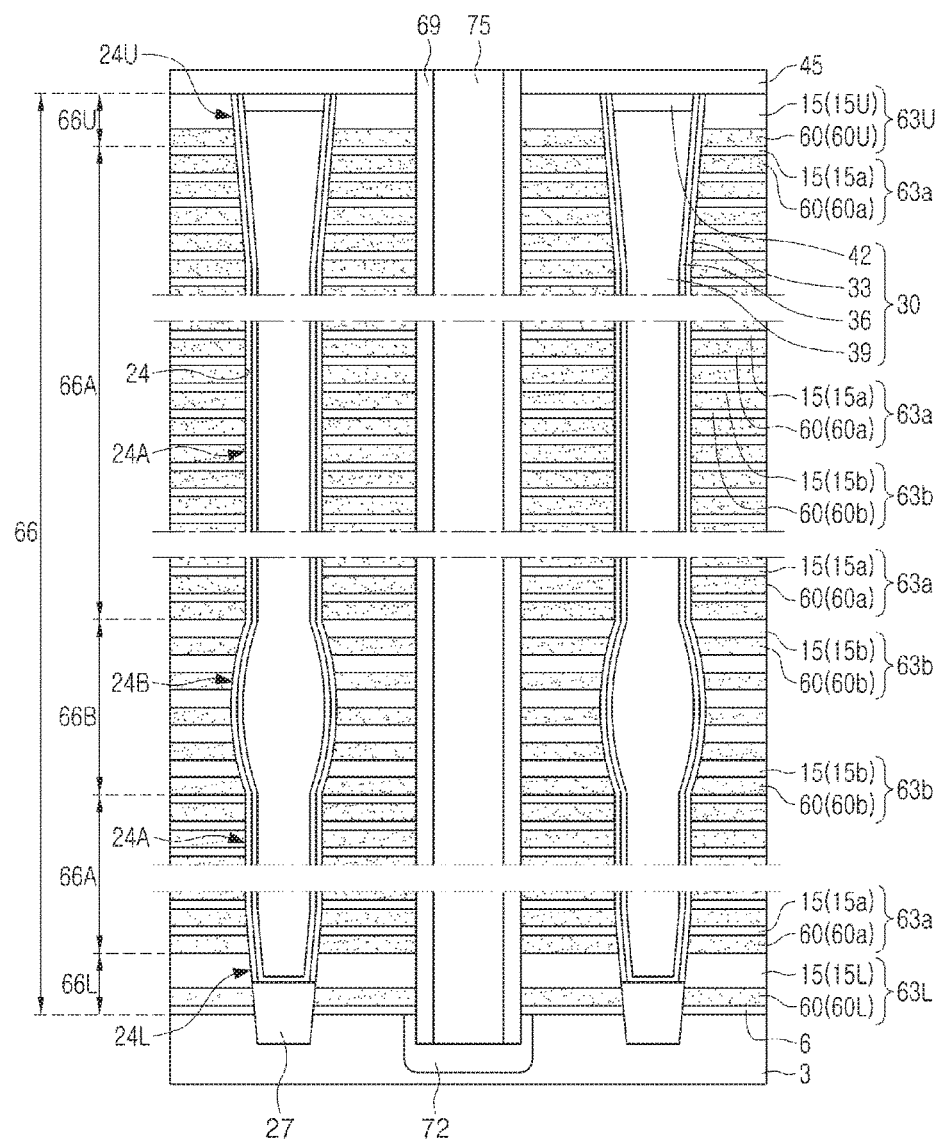

With reference to FIGS. 1 and 17, separation spacers 69 may be formed on a side wall of the separation opening 47 in FIG. 16. The separation spacers 69 may be formed of an insulating material such as a silicon oxide or the like.

An ion implantation process is performed to form an impurity region 72 inside the substrate 3 in a lower portion of the separation opening 47 in FIG. 16. The impurity region 72 and the pad 42 may have N-type conductivity, and the substrate 3 adjacent to the impurity region 72 may have P-type conductivity.

A separation pattern 75, with which a remaining portion of the separation opening 47 is filled, may be formed. The separation pattern 75 may be formed of a conductive material. The separation pattern 75 may be formed of doped silicon and/or a metallic material (e.g., tungsten or the like).

Again with reference to FIGS. 1 and 2, an intermetallic insulating layer 78 may be formed on the separation pattern 75 and the upper insulating layer 45. Contact plugs 81, passing through the intermetallic insulating layer 78 and the upper insulating layer 45 to be electrically connected to the pads 42, may be formed. A conductive line 84 electrically connected to the contact plugs 81 may be formed on the contact plugs 81.

According to some example embodiments, as described with reference to FIG. 11, a morphology defect of the holes 24 passing through the mold structure 9 may be limited and/or prevented from occurring. As described above, occurrence of the morphology defect of the holes 24 may be decreased, thereby improving productivity of a semiconductor device. The vertical structure 30 including the channel layer 36 inside the holes 24 passing through the mold structure 9 described above may be formed, and a process of replacing the sacrificial layers 12 of the mold structure 9 with the gates 60 is performed to form the stacked structure 66, in which the mold structure 9 includes the gates 60.

In order to increase integration of a semiconductor device, even when a number of the gates 60 inside the stacked structure 66 is increased, a defect of the holes 24 may be limited and/or prevented. Thus, integration of a semiconductor device may be improved.

The gates 60 may include word lines 60a of a memory device. When a memory device is operated using the word lines 60a described above and the vertical structures 30 including the channel layer 36 formed inside the holes 24, an erase/program speed defect of memory cells which occurs due to a morphology defect of the holes 24 may be limited and/or prevented.

As set forth above, according to example embodiments of inventive concepts, a morphology defect of holes passing through a mold structure or a stacked structure may be limited and/or prevented. The morphology defect of the holes may be decreased as described above to improve productivity of a semiconductor device. In addition, even when a number of gates inside the stacked structure is increased, a defect of the holes may be limited and/or prevented, thereby improving integration of a semiconductor device.

While some example embodiments have been shown and described above, it will be apparent to those skilled in the art that modifications and variations could be made without departing from the scope of inventive concepts as defined by the appended claims.

What is claimed is:

1. A semiconductor device comprising:
a substrate;
a stacked structure on the substrate,
the stacked structure including units stacked on top of each other in a direction perpendicular to a top surface of the substrate,
the stacked structure including a hole passing through the stacked structure,
the units including first units and second units between the first units,
the first units includes a plurality of first gates and a plurality of first interlayer insulating layers alternately stacked on top of each other,
the second units including a plurality of a second gates and a plurality of second interlayer insulating layers alternately stacked on top of each other, on and
a ratio of a thickness of one of the plurality of second interlayer insulating layers with respect to a thickness of one of the plurality of second gates is different from a ratio of a thickness of one of the plurality of first interlayer insulating layers with respect to a thickness of one of the plurality of first gates; and
a vertical structure in the hole.

2. The semiconductor device of claim 1, wherein
the hole includes first hole regions and a second hole region between the first hole regions, and
a width of the second hole region is greater than a width of the first hole regions adjacent to the second hole region.

3. The semiconductor device of claim 2, wherein
the first units define the first hole regions, and
the second units define second hole region.

4. The semiconductor device of claim 1, wherein
the thickness of the one of the plurality of first gates is the same as the thickness of the one of the plurality of second gates, and
the thickness of the one of the plurality of second interlayer insulating layers is thicker than the thickness of the one of the plurality of first interlayer insulating layers.

5. The semiconductor device of claim 1, wherein
the ratio of the thickness of the one of the plurality of second interlayer insulating layers with respect to the thickness of the one of the plurality of second gates is greater than the ratio of the thickness of the one of the plurality of first interlayer insulating layers with respect to the thickness of the one of the plurality of first gates.

6. The semiconductor device of claim 1, wherein
at least two of the plurality of second interlayer insulating layers have different thicknesses.

7. The semiconductor device of claim 6, wherein the thickness of the one of the plurality of first gates and the thickness of the one of the plurality of second gates are the same.

8. The semiconductor device of claim 1, wherein
the thickness of the one of the plurality of second gates is thinner than the thickness of the one of the plurality of first gates, and
the thickness of the one of the plurality of second interlayer insulating layers is thicker than the thickness of the one of the plurality of first interlayer insulating layers.

9. The semiconductor device of claim 1, wherein the second units are closer to a lower surface of the stacked structure than to an upper surface of the stacked structure.

10. The semiconductor device of claim 1, further comprising:
a semiconductor pattern inside the hole and below the vertical structure; and
a bit line on the stacked structure, wherein
the bit line is electrically connected to the vertical structure.

11. A semiconductor device comprising:
a substrate;
a stacked structure on the substrate,
the stacked structure including units stacked on top of each other in a direction perpendicular to a top surface of the substrate, the stacked structure including a hole passing through the stacked structure and having a bowing region,
the units including first units and a second unit between the first units,
each of the first units including a first gate and a first interlayer insulating layer on the first gate,
the second unit including a plurality of second gates and a plurality of second interlayer insulating layers alternately stacked on top of each other,
the second unit opposes at least a portion of the bowing region, and
a ratio of a thickness of one of the plurality of second interlayer insulating layers with respect to a thickness of one of the plurality of second gates is different from a ratio of a thickness of the first interlayer insulating layer with respect to a thickness of the first gate; and
a vertical structure in the hole.

12. The semiconductor device of claim 11, wherein
the hole includes first hole regions defined by the first units,
the bowing region of the hole is between the first hole regions of the hole,
a width of the bowing region is greater than a width of the first hole regions adjacent to the bowing region, and
the first hole regions oppose the first units.

13. The semiconductor device of claim 11, wherein the ratio of the thickness of the one of the plurality of second interlayer insulating layers with respect to the thickness of the one of the plurality of second gates is greater than the ratio of the thickness of the first interlayer insulating layer with respect to the thickness of the first gate.

14. The semiconductor device of claim 11, wherein the one of the plurality of second interlayer insulating layers is thicker than the first interlayer insulating layer.

15. The semiconductor device of claim 11, wherein the units further include a lower unit and an upper unit on the lower unit,
the first units and the second unit are between the lower unit and the upper unit,
the lower unit includes a lower gate and a lower interlayer insulating layer on the lower gate,
the upper unit includes an upper gate and an upper interlayer insulating layer on the upper gate, and
the upper interlayer insulating layer and the lower interlayer insulating layer are thicker than the first interlayer insulating layer and the one of the plurality of second interlayer insulating layers.

16. A semiconductor device comprising:
a substrate;
a stacked structure on the substrate,
the stacked structure including stacked regions stacked on top of each other in a direction perpendicular to a top surface of the substrate, the stacked structure including a hole passing through the stacked structure, the stacked regions including first stacked regions and second stacked region between the first stacked regions, each of the first stacked regions including a plurality of first layers and a plurality of first interlayer insulating layers alternately stacked on top of each other, the second stacked region including a plurality of second layers and a plurality of second interlayer insulating layers alternately stacked on top of each other, and a ratio of a thickness of one of the plurality of second interlayer insulating layers with respect to a thickness of one of the plurality of second layers is different from a ratio of a thickness of one of the plurality of first interlayer insulating layers with respect to a thickness of one of the plurality of first layers, the plurality of first layers and the plurality of second layers being a plurality of first gates and a plurality of second gates, respectively, or a plurality of first sacrificial layers and a plurality of second sacrificial layers, respectively; and a vertical structure in the hole.

17. The semiconductor device of claim 16, wherein the plurality of first layers are is the plurality of first gates, the plurality of second layers are the plurality of second gates, and the hole in the stacked structure has a bowing region surrounded by at least some of the plurality of second layers and the plurality of second interlayer insulating layers.

18. The semiconductor device of claim 16, further comprising:

a semiconductor pattern inside the hole and below the vertical structure; and a bit line on the stacked structure, wherein the bit line is electrically connected to the vertical structure.

19. The semiconductor device of claim 16, wherein the plurality of first layers are the plurality of first sacrificial layers, the plurality of second layer are the plurality of second sacrificial layers, and the hole in the stacked structure has a bowing region surrounded by at least some of the plurality of second layers and the plurality of second interlayer insulating layers.

20. The semiconductor device of claim 16, wherein the second stacked region is closer to a lower surface of the stacked structure than to an upper surface of the stacked structure.

* * * * *